US007555735B2

(12) United States Patent
Papadopoulou et al.

(10) Patent No.: US 7,555,735 B2
(45) Date of Patent: *Jun. 30, 2009

(54) IC DESIGN MODELING ALLOWING DIMENSION-DEPENDENT RULE CHECKING

(75) Inventors: Evanthia Papadopoulou, New York, NY (US); Daniel N. Maynard, Craftsbury Common, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/926,289

(22) Filed: Oct. 29, 2007

(65) Prior Publication Data

US 2008/0059929 A1  Mar. 6, 2008

Related U.S. Application Data

(63) Continuation of application No. 10/708,039, filed on Feb. 4, 2004, now Pat. No. 7,404,164.

(51) Int. Cl.
*G06F 17/50* (2006.01)

(52) U.S. Cl. .............................................. 716/1; 716/5
(58) Field of Classification Search ...................... 716/7, 716/1, 5
See application file for complete search history.

(56) References Cited

U.S. PATENT DOCUMENTS

| 6,178,539 | B1 | 1/2001 | Papadopoulou et al. | |
| 6,317,859 | B1 * | 11/2001 | Papadopoulou | 716/4 |
| 7,404,164 | B2 * | 7/2008 | Papadopoulou et al. | 716/7 |
| 2003/0140330 | A1 | 7/2003 | Tanaka et al. | |
| 2004/0064269 | A1 | 4/2004 | Shibuya et al. | |
| 2004/0096092 | A1 * | 5/2004 | Ikeda | 382/141 |
| 2004/0230930 | A1 | 11/2004 | Lippincott et al. | |
| 2008/0069451 | A1 * | 3/2008 | Ikeda | 382/199 |

OTHER PUBLICATIONS

Papadopoulou, et al., "The Loo Voronoi Diagram of Segments and VLSI Applications," 2001 International Journal of Computational Geometry & Applications, vol. 11, No. 5, 26 pages.

(Continued)

*Primary Examiner*—Paul Dinh
*Assistant Examiner*—Suchin Parihar
(74) *Attorney, Agent, or Firm*—Ryan K. Simmons; Hoffman Warnick LLC

(57) ABSTRACT

A method, system and program product to model an IC design to include dimensions such as a local width and spacing of IC shapes in a consistent fashion. In particular, the invention uses a core portion of Voronoi diagrams to partition edges of a shape into intervals and assigns at least one dimension to each interval such as a local width and spacing. Dimension assignment can be made as any desirable definition set for width and spacing, e.g., numerical values or continuous dimension-dependent design rules. Design rule checking for dimension-dependent spacing rules given in any arbitrary functional form of width and spacing is possible. Application of the invention can be made anywhere the width and spacing of VLSI shapes play a role, e.g., relative to a single edge, neighboring edges, neighboring shapes, and/or for edges in more than one layer of the IC design.

13 Claims, 17 Drawing Sheets

OTHER PUBLICATIONS

Papadopoulou, et al., "Critical Area Computation via Voronoi Diagrams," 1999 IEEE Transactions on Computer-Aided Design of Integrated Circuits and Systems, vol. 18, Issue 4, 12 pages.

Papadopoulou et al., U.S. Appl. No. 10/708,039, BUR 920030149US1, Office Action Communication, Jan. 8, 2007, 10 pages.

Papadopoulou et al., U.S. Appl. No. 10/708,039, BUR 920030149US1, Office Action Communication, Apr. 17, 2007, 2 pages.

Papadopoulou et al., U.S. Appl. No. 10/708,039, BUR 920030149US1, Office Action Communication, Jul. 30, 2007, 9 pages.

Papadopoulou et al., U.S. Appl. No. 10/708,039, BUR 920030149US1, Office Action Communication, Oct. 23, 2007, 9 pages.

Papadopoulou et al., U.S. Appl. No. 12/186,769, BUR 920030149US4, Office Action Communication, Jan. 28, 2009, 16 pages.

* cited by examiner

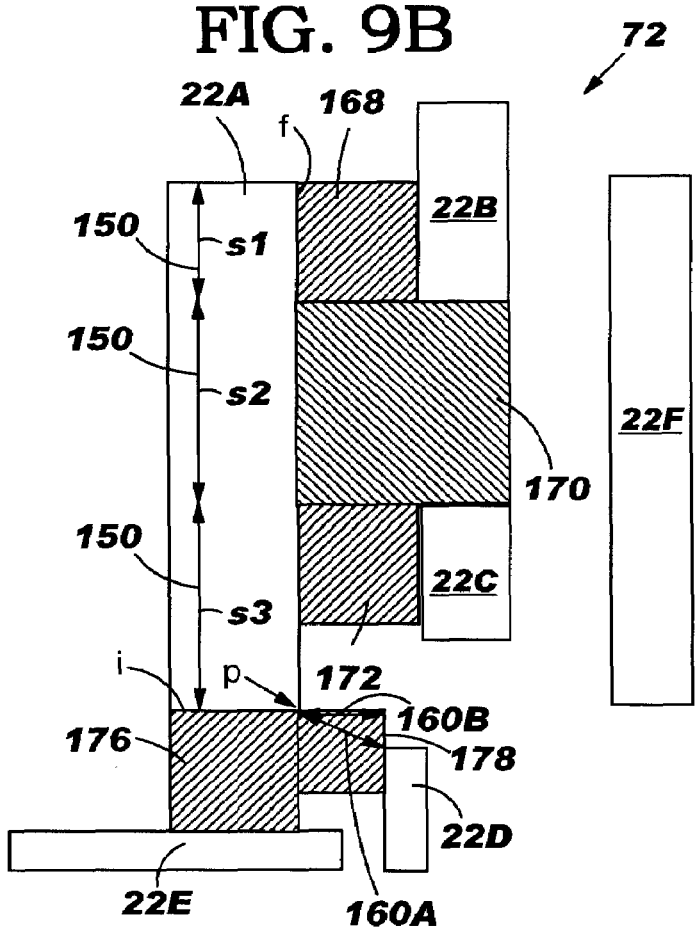
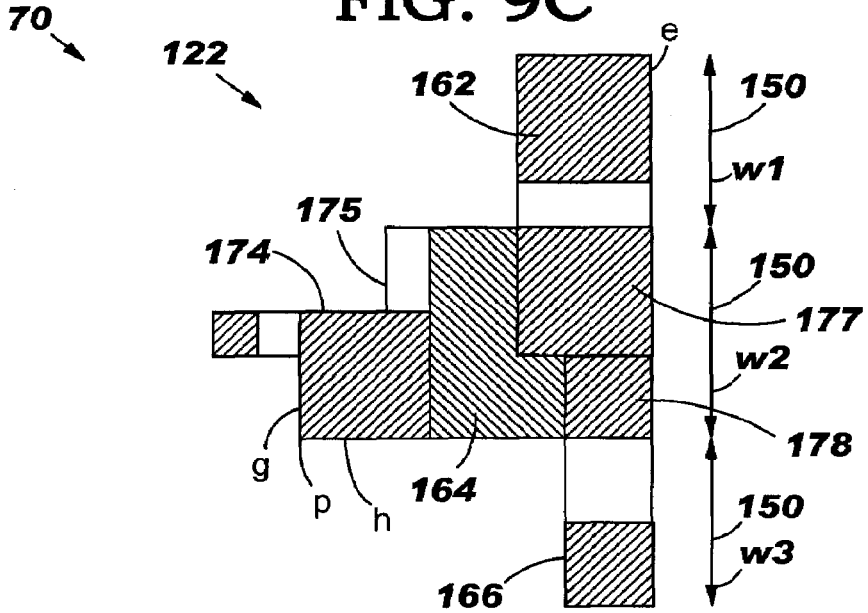

IC DESIGN MODELING ALLOWING DIMENSION-DEPENDENT RULE CHECKING

CROSS-REFERENCE TO RELATED APPLICATIONS

This application is a continuation of co-pending U.S. patent application Ser. No. 10/708,039, filed on Feb. 4, 2004.

BACKGROUND OF THE INVENTION

1. Technical Field

The present invention relates generally to integrated circuit design, and more particularly, to integrated circuit design modeling that allows for dimension-dependent rule checking.

2. Related Art

Very large scale integrated (VLSI) circuits are designed using computer-implemented design systems that allow a designer to generate and test a circuit design before the more expensive manufacturing of the integrated circuit (IC). In order to ensure proper design of an IC, each design system and/or IC format includes a set of design rules that each circuit design must meet. That is, each IC design must pass a design rule check (DRC). One fundamental operation of DRC is dimension-dependent rule checking. Dimension-dependent rule checking ensures that dimensions, namely width and spacing, of parts of an IC meet a specific dimensional parameter, e.g., a size range. Among the most significant dimension-dependent rule checking are the width-dependent and spacing-dependent rules that prevent IC parts from being too large/small or too close together/too far apart.

Current DRC tools derive width and spacing of VLSI shapes using one-dimensional visibility or standard "shape-expand" and "shape-shrink" operations. Advancements in IC design have resulted in the various shapes of IC parts becoming more complex than simple rectangles. As a result, defining what is a "width" of a shape(s), or what is the "spacing" between shapes has become difficult and inconsistent. In particular, the conventional mathematical definition of "width" of any polygon is the smallest distance between any two parallel lines of support. This definition implies a unique width for any shape based on its convex hull. (Note that typically an IC non-convex polygon can be much more "narrow" than its associated convex hull, e.g., an L-shape). However, this definition is not appropriate for DRC among non-convex shapes as it assigns the unique width of the convex hull to the whole shape.

Where a DRC method uses one-dimensional (1D) visibility, the width or spacing near a vertical edge is often determined by other vertical edges that this edge can "see" along the horizontal direction. This approach is adequate in some cases but it often leads to results that are inconsistent as 1D visibility is not appropriate to characterize the width of a shape. For example, for any edge having a distance to another edge that varies along its length results in the width being inconsistent or indeterminable. Currently, there is no consistent or satisfactory definition for the "width" of an arbitrary shape(s) other than a rectangle. The above-described problem applies to spacing-dependent design rules also.

With regard to "expand" and "shrink" operations, most modern shape processing tools have functions that expand or shrink a shape by a given constant amount. The results of these operations are incrementally used to determine width and spacing. There are several problems with such an approach. First, the expand and shrink operation can give correct width results only for shapes consisting of axis parallel edges. Once an acute angle is present the results become incorrect. In addition, the expand and shrink operation is simple only in the case of convex shapes. For general non-convex shapes, even orthogonal ones, the expand and shrink operation is difficult and rather expensive in terms of computational time. Furthermore expand and shrink operations work only for given constant amounts and, therefore, many calls to these functions are typically required for standard shapes. As a result, the checking of dimension dependent rules becomes very cumbersome and time consuming.

One approach to checking spacing dependent rules is to represent a rule in a discrete form given by a small number of "buckets." "Buckets" are rule implementations based on predefined numeric values or ranges of predefined numeric values. For example, buckets for spacing may mandate that a space be greater than a dimension S if at least one line has a width greater than a value W. In another example, a space is greater than or equal to a dimension S if both lines are greater than a value W. Using the expand/shrink approach to check this type rule is cumbersome and time consuming. Checking width-dependent spacing rules given in a function form (i.e., non-step or non-bucketed) would be even more cumbersome (if at all possible) by employing such methods. For example, it is not known how to implement a width-dependent rule that mandates that the spacing between two neighboring shapes must be 2× the maximum width of one of the shapes minus 10 units.

In addition to the above problems, use of buckets leads to IC designs that are hard to manufacture. In particular, there are two problems that result from the IC design rule implementation using buckets. The first problem is based on the premise that design rules are established prior to the creation of a manufacturable process, and thus, the design rules represent assumptions and commitments of the process made during design. Typically, however, process constraints usually deviate by some amount upon reaching manufacturing. Therefore, a design rule legal layout may be outside the process window capability of the manufacturing process. Avoiding this problem infers that all of a specific "bucket" lies within the manufacturing process capability, which leads to the second problem where productivity is "left on the table." In particular, the "bucketed" design rules motivate the designer to use the limit provided rather than what is optimal (assuming the process does not follow the same function as the buckets). In particular, designers actually make calculations based on the bucket specifications to determine which size wires to use rather than using the size wire that optimizes their functionality and performance requirements. The end results lead to a non-optimal IC design.

Another problem relative to DRC is that design rules capture diverse physical phenomena, each of which may require a slightly different definition of width and spacing as long as the definition can be treated in a consistent manner. For example in certain cases a shape may need to be evaluated as "thin" as possible, while in other cases it may need to be evaluated as "fat" as possible. Currently, no mechanism exists for applying different definitions of width and spacing for DRC.

In view of the foregoing, there is a need in the art for a way to model an IC design that allows for dimension-dependent design rule checking regardless of shape. It would also be advantageous to be able to implement different definitions of width and spacing.

SUMMARY OF THE INVENTION

The invention provides a method, system and program product to model an IC design to include dimensions such as a local width and spacing of IC shapes in a consistent fashion. In particular, the invention uses a core part of Voronoi diagrams to partition edges of a shape into intervals and assigns at least one dimension to each interval such as a local width and spacing. Dimension assignment can be made as any desirable definition set for width and spacing, e.g., numerical values or continuous dimension-dependent design rules. Design rule checking for dimension-dependent spacing rules given in any arbitrary functional form of width and spacing is possible. Application of the invention can be made anywhere the width and spacing of VLSI shapes play a role, e.g., relative to a single edge, a neighboring edges, a neighboring shapes, and/or for edges in more than one layer of the IC design.

A first aspect of the invention is directed to a method of modeling for use with an integrated circuit (IC) design, the method comprising the steps of: partitioning an edge of a shape in the IC design into a plurality of intervals; and assigning at least one dimension to each interval.

A second aspect of the invention is directed to an integrated circuit (IC) modeling system comprising: means for partitioning an edge of a shape in the IC design into a plurality of intervals; and means for assigning at least one dimension to each interval.

A third aspect of the invention is directed to a computer program product comprising a computer useable medium having computer readable program code embodied therein for modeling an integrated circuit, the program product comprising: program code configured to partition an edge of a shape in the IC design into a plurality of intervals; and program code configured to assign at least one dimension to each interval.

A fourth aspect of the invention is directed to an integrated circuit (IC) check rule evaluation system comprising: means for partitioning an edge of a shape in the IC design into a plurality of intervals, the partitioning means including: means for generating a core Voronoi diagram for the shape using a first metric, and means for partitioning the edge based on the core Voronoi diagram; means for assigning at least one dimension to each interval using a second metric; and means for using the at least one dimension to evaluate a check rule.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein:

FIGS. 9B-9C show illustrative implementation of the method of FIG. 7 relative to the set of polygons and polygon of FIGS. 2A and 2B, respectively.

DETAILED DESCRIPTION OF THE INVENTION

For purposes of clarity only, the following description includes the following sections: I. Overview, II. General Definitions, III. System Overview, IV. Methodology, and V. Conclusion.

I. Overview

IC design rules and computer-aided design (CAD) tools normally work with boundaries of IC shapes. The invention leverages this fact by partitioning an edge of a shape into a plurality of intervals. Each interval is then assigned a dimension, including in one embodiment a local width and a local spacing, based on discrete neighboring geometry as derived from a local Voronoi diagram in the interior and/or exterior of the shape. In other words, a local width and local spacing can be mapped to an edge of a shape. As a result, every boundary point of a shape may be assigned a unique width label and a unique spacing label.

A definition set determines how an edge is partitioned and how width and spacing are assigned for an edge. Definition sets may vary depending on design rules. Accordingly, the assignments of width/spacing can reflect the nature of the design rule of interest and need not be the same for all rules. In addition, each interval can have a constant width/spacing value or it can be assigned a function such as the distance from another boundary/corner, a factor of another dimension or other function. Once widths and spacings are obtained they can be compared against each other to check any kind of relation between them, and, in particular, can be checked for compliance with continuous dimension-dependent design rules.

II. General Definitions

As noted above, the invention implements Voronoi diagrams to determine dimensions, i.e., local widths and spacings, of shapes. A "Voronoi diagram" may take a variety of forms depending on the structure to which it is applied. In the simplest example, referring to FIG. 1, a "Voronoi diagram" 8 for a set of sites (points) 10a-10d includes all points that are closer to a corresponding site, e.g., 10a, than to any other site 10b-10d. The resulting Voronoi diagram 8 includes a collection of regions 12a-12d, called "Voronoi cells," that divide up the plane in which sites 10a-10d sit, i.e., the plane of the page. Each Voronoi cell 12a-12d is in the shape of a convex polygon (for point sites only) having edges that are bisectors of sites 10a-10d. Each Voronoi cell 12a-12d corresponds to, or is owned by, one of sites 10a-10d. Again, all points in one cell, e.g., 12a, are closer to the corresponding site 10a than to any other site 10b-10d.

Figure 2A:
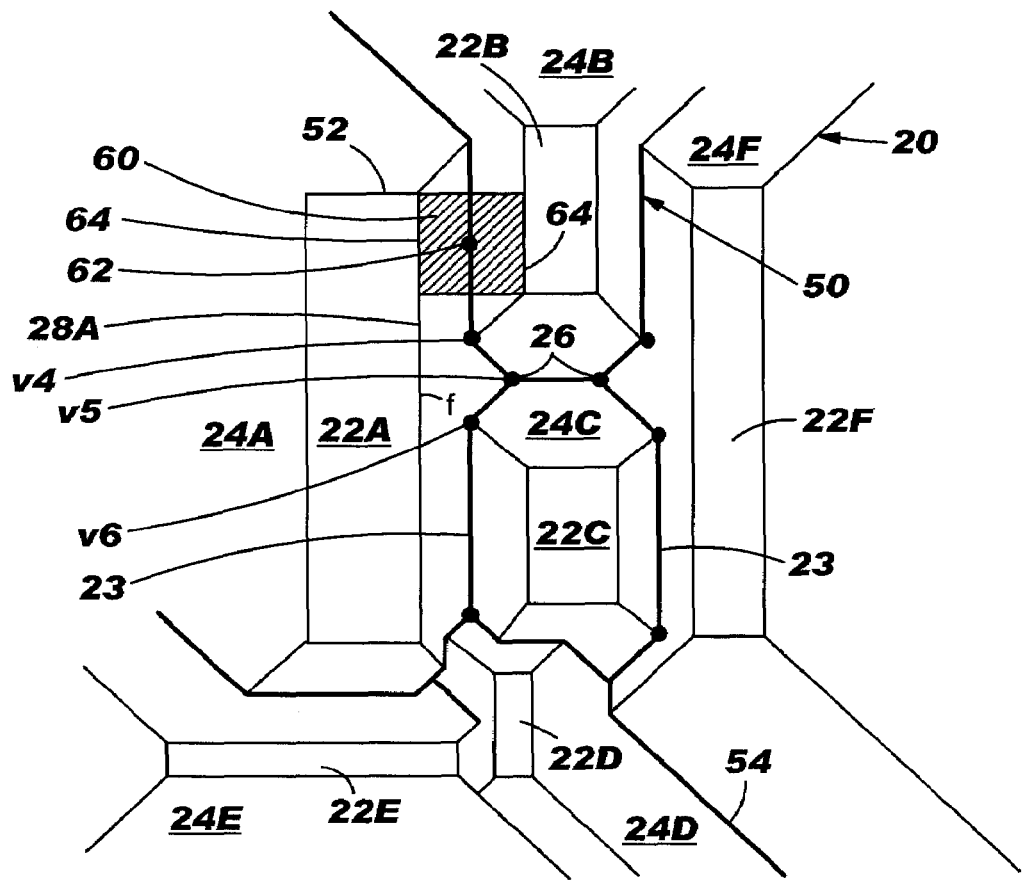
FIG. 2A shows an exterior Voronoi diagram for a set of polygons using the $L_\infty$ metric.
Figure 2B:
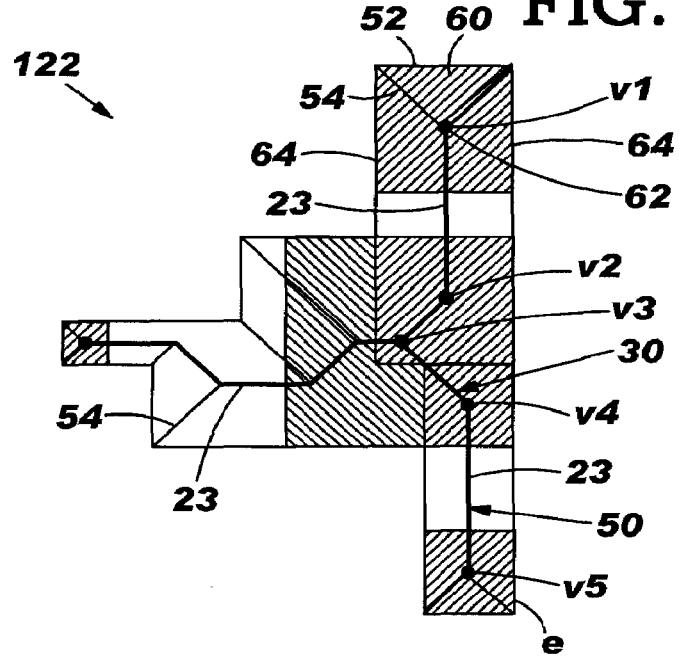
FIG. 2B shows an interior Voronoi diagram for a polygon using the $L_\infty$ metric.
Figure 3:
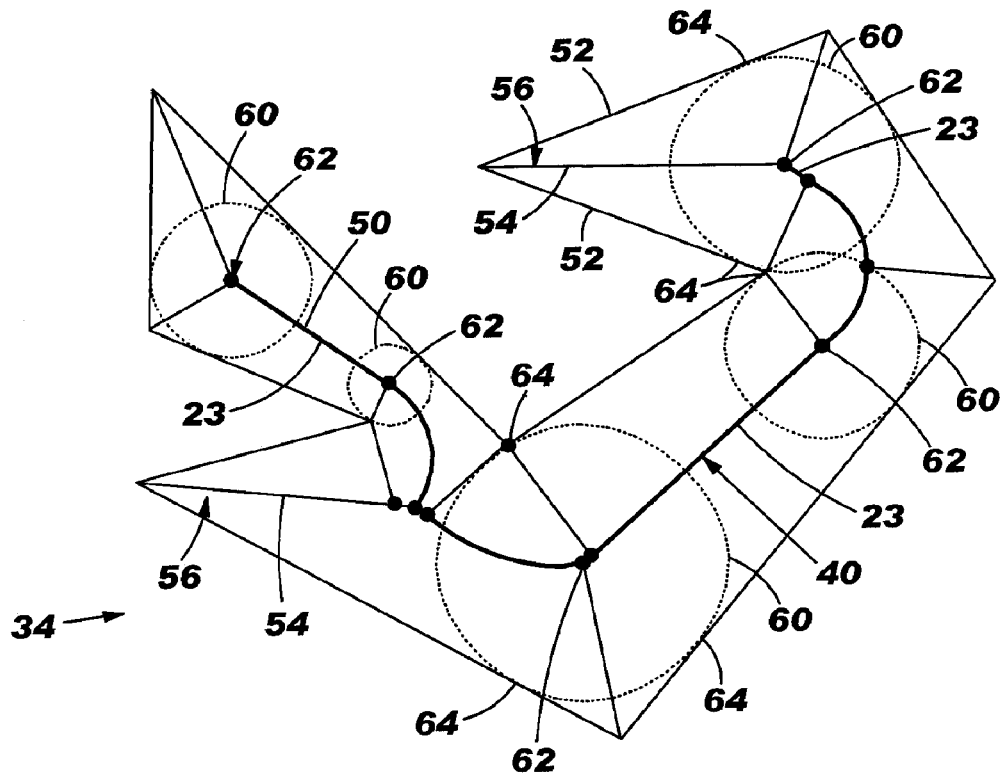
FIG. 3 shows an interior Voronoi diagram for an acute polygon using the Euclidean metric.
Figure 4:
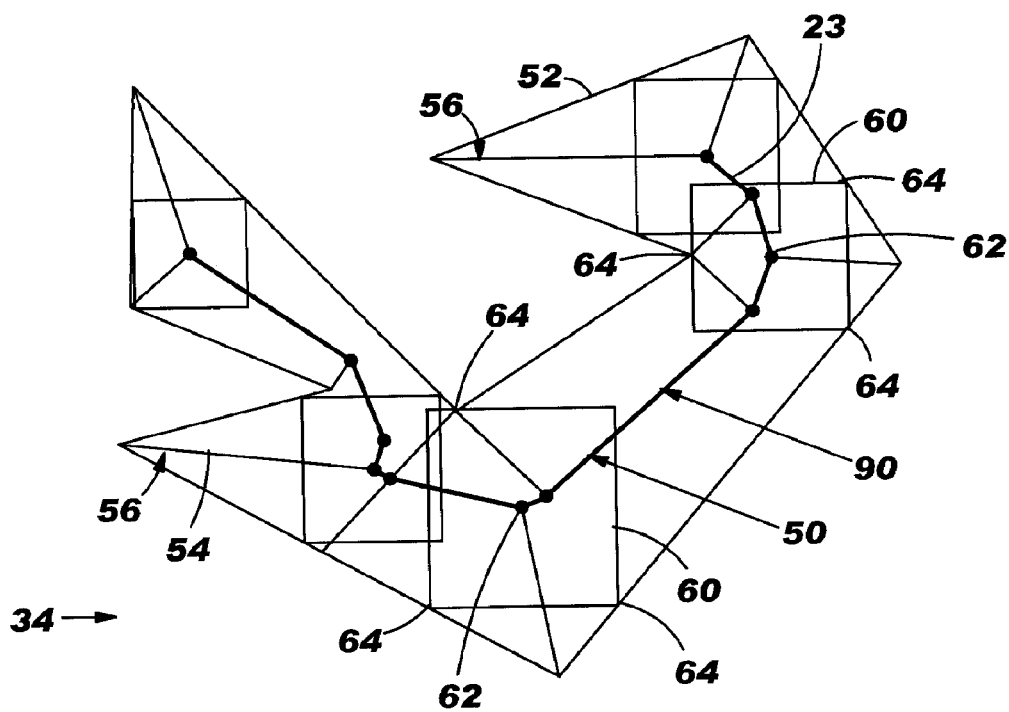
FIG. 4 shows an interior Voronoi diagram for the acute polygon of FIG. 3 using the $L_\infty$ metric.

FIGS. 2A-2B illustrate an exterior Voronoi diagram 20 and an interior Voronoi diagram 30 for orthogonal shapes, respectively. FIG. 2A illustrates a set of disjointed polygonal sites 22A-22F, and FIG. 2B illustrates a polygon 122. FIGS. 3 and 4 illustrate interior Voronoi diagrams 40, 90 for an acute polygon shape 34. As used herein, the term "boundary" shall refer to an outer border or line of a shape, while an "edge" shall refer to a component of the boundary.

As shown in FIG. 2A, an external Voronoi diagram 20 for a set of disjoined polygonal sites, i.e., polygons 22A-22F, includes a partitioning of the plane containing polygons 22A-22F into Voronoi cells 24A-24F. Each Voronoi cell, e.g, 24A, for a polygon 22A includes a locus of points closer to polygon 22A than to any other polygon 22B-22F. That is, it includes bisectors of adjacent polygons 22B-22F (others not shown). A Voronoi cell of a site s, e.g., polygon 22A, is denoted as reg(s) and polygon 22A is referred to as the owner of reg(s). A portion 23 of Voronoi diagram 20 that borders two Voronoi cells 24A and 24B is referred to as a "Voronoi edge," and includes portions of bisectors between the owners of cells. A point 26 where three or more Voronoi edges 23 meet is called a "Voronoi vertex." Dashed lines indicate partitioning of polygons 22A-22F such that each boundary, e.g., 28A, of a polygon 22A has a corresponding portion 23 of Voronoi diagram 20.

Referring to FIGS. 2B, 3 and 4, an interior Voronoi diagram 30, 40, 90 on an interior of a shape 34 (polygon 122 in FIG. 2B) is referred to as a "medial axis." Formally, the "medial axis" is the locus of points [q] internal to a polygon such that there are at least two points on the object's boundary that are equidistant from [q] and are closest to [q].

Figure 1:
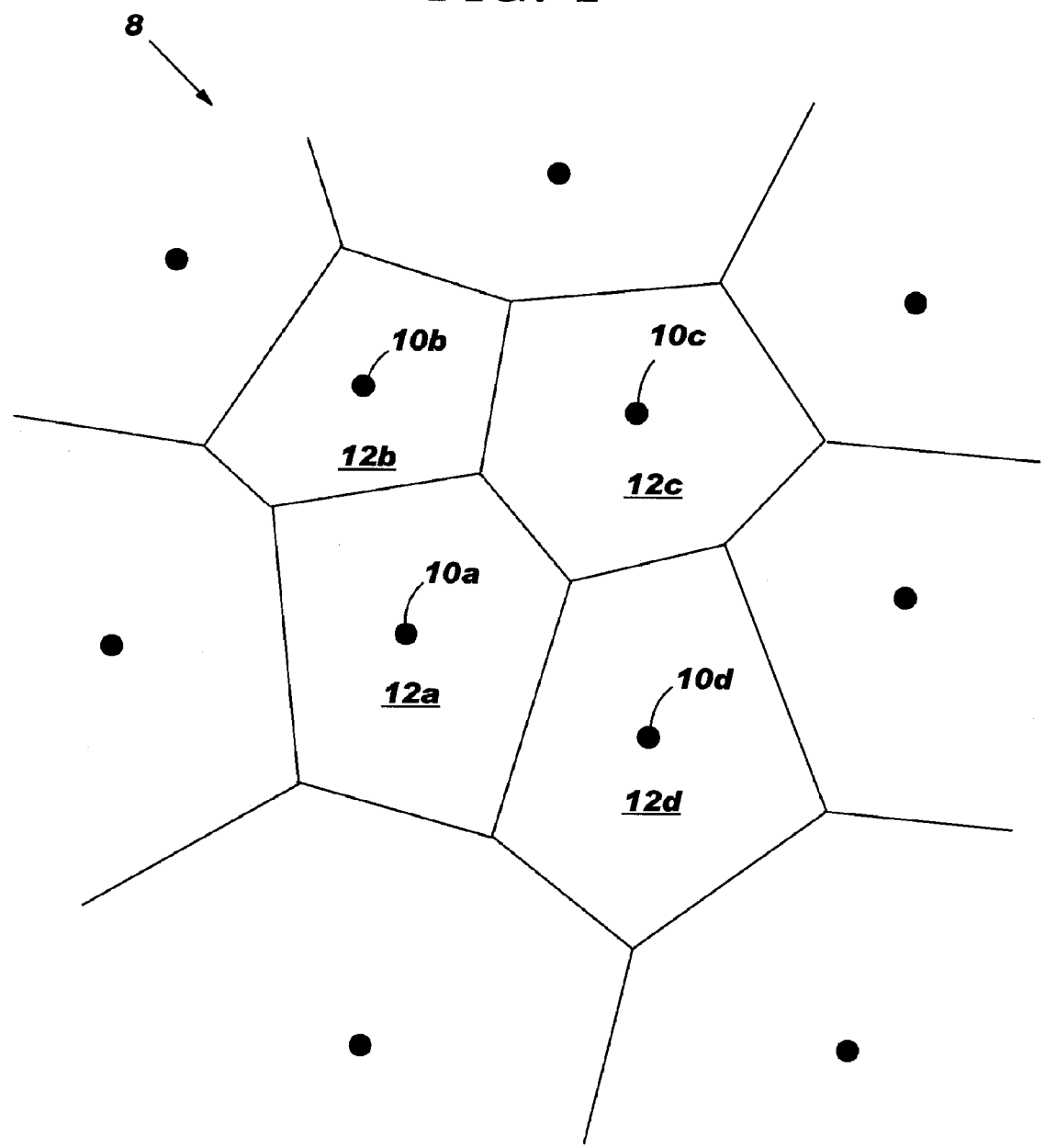
FIG. 1 shows a simplified example of a Voronoi diagram.
Figure 5A:
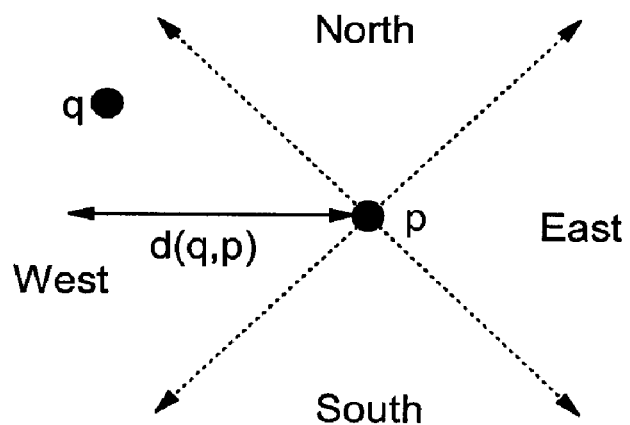
FIGS. 5A-5B show illustrations for description of the $L_\infty$ metric.
Figure 5B:
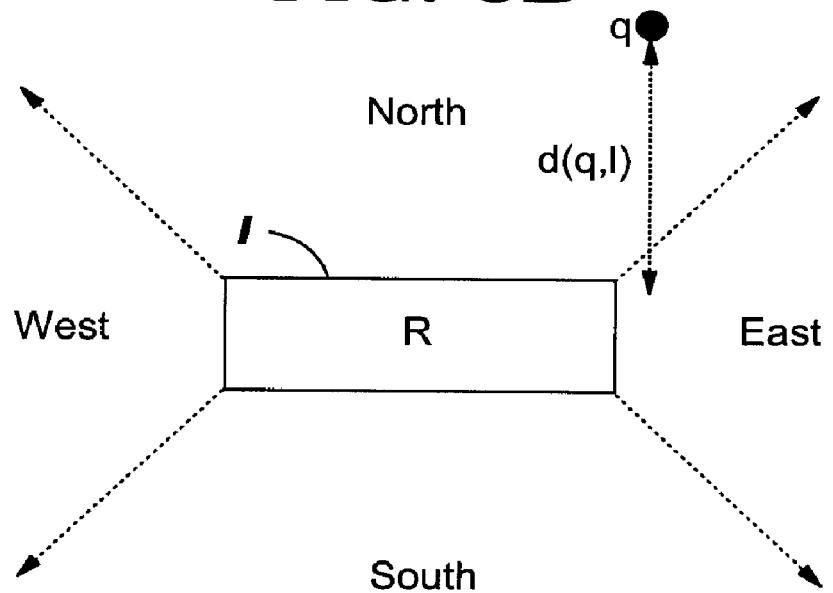

The above-described Voronoi diagrams of FIGS. 1 and 3 are illustrated as based on the Euclidean metric. That is, Voronoi distances are based on the Euclidean metric. The invention, as will be described further below, may also implement Voronoi diagrams based on an $L_\infty$ (L-infinity) metric. Referring to FIGS. 5A-5B, in the $L_\infty$ metric, the distance between two points (FIG. 5A) $p=(x_p, y_p)$ and $q=(x_q, y_q)$ is the maximum of the horizontal distance and the vertical distance between p and q, i.e., $$d(p,q)=\max[|x_p-x_q|,|y_p-y_q|].$$

Intuitively, the $L_\infty$ distance is the size of the smallest square touching p and q. The $L_\infty$ distance between any two points is less than or equal to the Euclidean distance between the points. Further, in the $L_\infty$ metric, the distance between a point p and a line l (FIG. 5B) is $d(p,l)=\min[d(p,q),\forall q \in l]$. The $L_\infty$ bisector of two polygonal elements (points or lines) is the locus of points at equal $L_\infty$ distance from the two elements.

Returning to FIG. 4, medial axis 90 of shape 34 is illustrated as based on the $L_\infty$ metric. (Medial axis 30 in FIG. 2B is also based on the $L_\infty$ metric). As easily discerned by comparing FIGS. 3 and 4, the use of the $L_\infty$ metric simplifies Voronoi diagram 90 of polygonal objects and makes it simpler to compute. The $L_\infty$ Voronoi diagrams are a "skeleton" of straight-line segments having linear combinational complexity. While methodology of the invention will be described based on one or the other metric, it should be recognized that the concepts and functioning of the invention are the same regardless of the metric used, and the invention should not be limited to any particular metric other than as set forth in the attached claims.

Further explanation of Voronoi diagrams and their application to critical area determination can be found in U.S. Pat. Nos. 6,317,859 and 6,178,539, which are hereby incorporated by reference for all purposes. See also, E. Papadopoulou et al., "The $L_\infty$ Voronoi Diagram of Segments and VLSI Applications," International Journal of Computational Geometry and Applications, Vol. 11, No. 5, 2001, 503-528.

Returning to FIGS. 2A, 2B, 3 and 4, a "core" 50 (indicated by thicker line) of a Voronoi diagram 30, 40, 90 is the portion remaining after excluding "uninteresting portions." Typically, "uninteresting portions" (lighter lines) are portions of Voronoi edges coupled to a boundary 52 (FIGS. 2B, 3 and 4) of the shape, e.g., bisectors 54 between adjacent edges. In the case of IC shapes with acute angles (i.e., concave vertices), as shown in FIGS. 3 and 4, "uninteresting" can be a portion of a bisector 54 coupled to an acute angle 56 at a certain distance from acute angle 56. What is excluded from core 50 can be flexible and application dependent. For simplicity, core 50 shall include all Voronoi edges 23 that are not coupled to boundary 52 of shape 34, i.e., all bisectors between non-adjacent edges and non-degenerate bisectors. A "degenerate bisector" is one between two collinear horizontal/vertical edges. However, it should be clear that core 50 is the "interesting" subset of a Voronoi diagram 30, 40, 90 where the "interesting" classification can vary for each application.

A "spot defect" is caused by particles such as dust or other contaminants in materials and equipment and are classified as two types: "extra material" defects causing a short between different conducting regions, e.g., 22A-22F of FIG. 2A, and "missing material" defects causing an open, e.g., in polygon 122 of FIG. 2B. In other words, a "short" is a defect creating a bridge with some other edge in the exterior of a shape while an "open" is a defect creating a void in the interior of a shape. Referring to FIG. 3, a spot defect may be modeled as a "core element" 60 in the form of a circle (Euclidean metric only) or a square ($L_\infty$ metric in FIGS. 2A, 2B and 4). That is, a "core element" 60 can be represented by a circle or a square depending on the metric used. Since, in reality, spot defects have any kind of shape, the square ($L_\infty$ metric) defect model is good for most purposes. The term "core disk" will be used to refer to the circles of the Euclidean metric, and "core square" will be used to refer to the square of the $L_\infty$ metric, and the term "core element" is generic to both.

A "core element" 60 touches a boundary 52 in at least two points 64, and has a center referred to as a "core point" 62, which is a member of core 50 for a shape, e.g., polygon 122 in FIG. 2B. Each core point 62 is weighted with twice its distance from boundary 52 of a shape, i.e., the diameter of it's core element. That is, each core point 62 is weighted with twice the radius of an associated core element 60. In the Euclidean metric, there is at most one core disk touching a boundary point except from concave vertices of the shape that can be touched by multiple core elements 60. In contrast, in the $L_\infty$ metric, there may be more than one core square touching a boundary point. See, for example, point p in FIG. 12. In particular, in the $L_\infty$ metric, where core squares are axis-parallel squares, boundary points along axis parallel boundary edges can be touched by more than one core square. The "radius of a square" is defined as half the size of its side. The above-described weighting provides a mechanism to map dimensions (width or spacing) information of a Voronoi diagram (interior or exterior) to the boundary of a shape.

A "core element" 60 may also be called a "minimal open" where core point 62 is in the interior of a shape because any shrinking of core element 60 (i.e., of the wire formed by the shape) of $\epsilon>0$ makes it such that core element 60 stops overlapping any boundary point 64, thus ceasing to create an open circuit. $\epsilon$ is a positive number arbitrarily small, and to shrink $\epsilon$ means to move the edges of a defect towards an interior of the defect by a distance $\epsilon$. Similarly, referring to FIG. 2A, a "core element" 60 may also be called a "minimal short" where core point 62 is external of a shape, e.g., polygons 22A, 22B, because any shrinkage of core element 60 (i.e., spacing between wires) of ∈>0 (same definition as above) makes it such that core element 60 stops overlapping any boundary point 64 of a shape 22A, 22B, thus ceasing creation of a short circuit.

A "definition set" is one or more definitions that allow for partitioning of an edge of a shape and assigning of at least one dimension (either as a constant value or a function) to each interval.

Other definitions will be provided, as necessary in the description that follows.

III. System Overview

Figure 6:
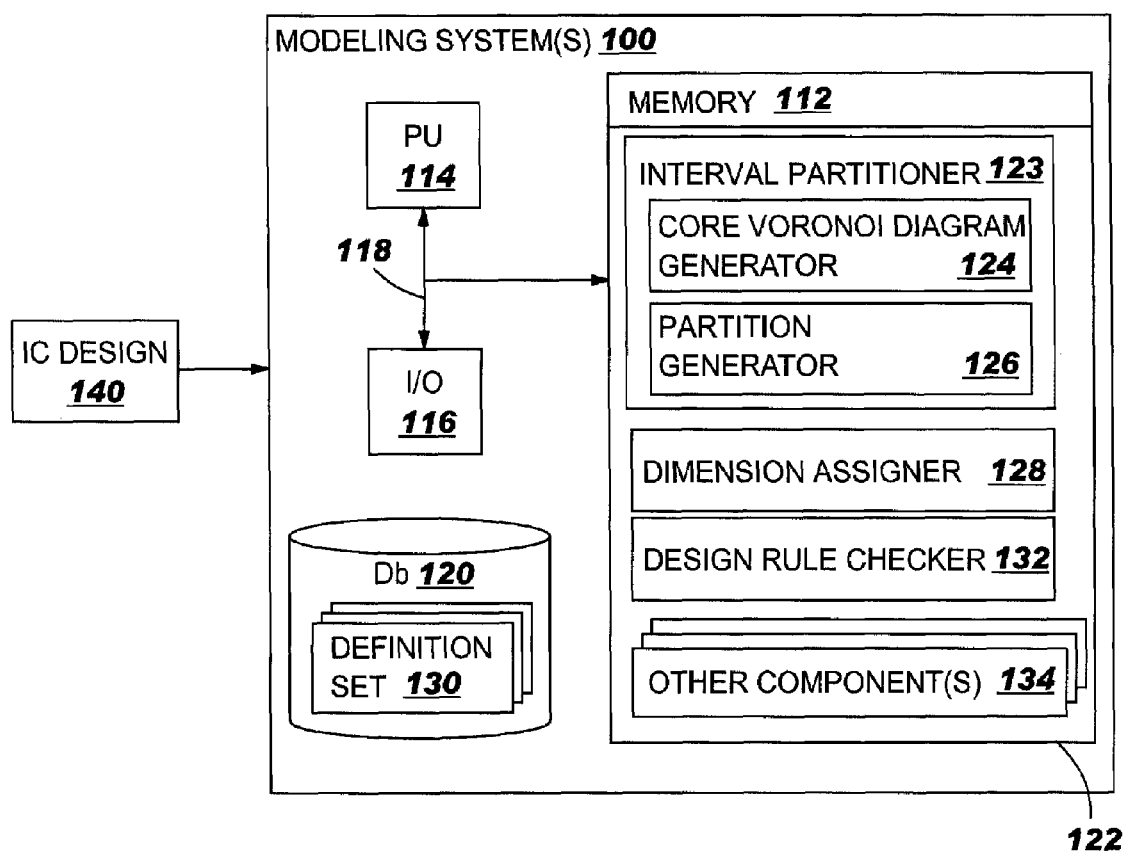
FIG. 6 shows a block diagram of a modeling system according to the invention.

With reference to the accompanying drawings, FIG. 6 shows a block diagram of a modeling system 100 in accordance with the invention. Modeling system 100 includes a memory 112, a processing unit (PU) 114, input/output devices (I/O) 116 and a bus 118. A database 120 may also be provided for storage of data relative to processing tasks. Memory 112 includes a program product 122 that, when executed by PU 114, comprises various functional capabilities described in further detail below. Memory 112 (and database 120) may comprise any known type of data storage system and/or transmission media, including magnetic media, optical media, random access memory (RAM), read only memory (ROM), a data object, etc. Moreover, memory 112 (and database 120) may reside at a single physical location comprising one or more types of data storage, or be distributed across a plurality of physical systems. PU 114 may likewise comprise a single processing unit, or a plurality of processing units distributed across one or more locations. I/O 116 may comprise any known type of input/output device including a network system, modem, keyboard, mouse, scanner, voice recognition system, CRT, printer, disc drives, etc. Additional components, such as cache memory, communication systems, system software, etc., may also be incorporated into system 100.

As shown in FIG. 6, program product 122 may include an interval partitioner 123 having a core Voronoi diagram generator 124 and a partition generator 126, and a dimension assigner 128. At least one definition set 130 may be provided for use by system 100, as will be described below. A design rule checker 132 may also be provided as part of system 100, or it may be configured as a separate system. Other system components 134 include any other program product necessary to implement the invention and not otherwise described herein, e.g., user interfaces, communications, etc.

An IC design 140 is provided to modeling system 100 and is modeled according to the following methodology. It should be recognized that modeling system 100 may be provided as a stand-alone system or as part of a larger IC design system as now known or later developed.

IV. Methodology

Figure 7:
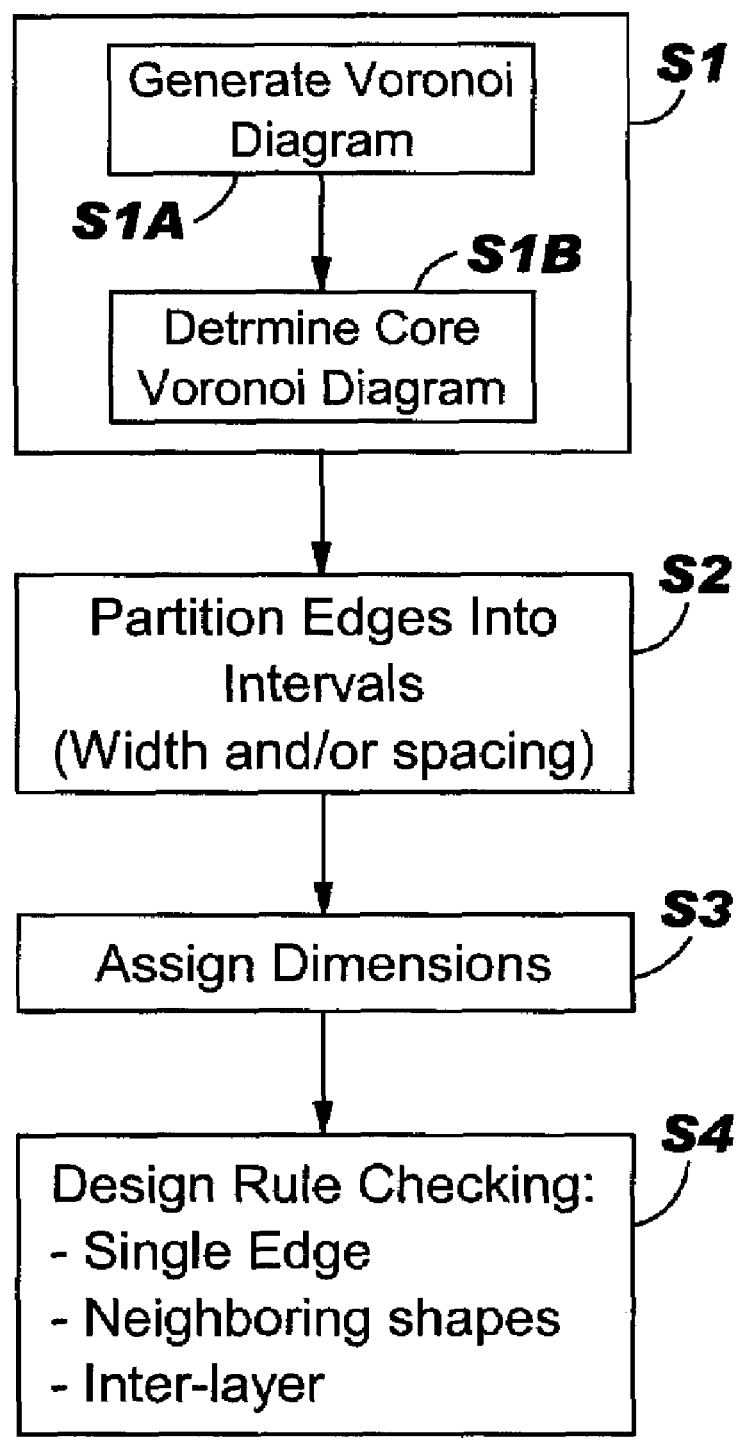
FIG. 7 shows a flow diagram of operation of the modeling system of FIG. 6.

Referring to FIG. 7, a flow diagram of operation of modeling system 100 will now be described. The processing of FIG. 7 will be described, first, relative to an (arbitrary acute-polygon) shape 34 as originally shown in FIGS. 3 and 4, and also shown in FIGS. 8A-8D. Shape 34 is an unlikely occurrence in a VLSI design, but facilitates a good understanding of the overall methodology. To further facilitate a good understanding, the process description relative to shape 34 will be made relative to the Euclidean metric. Subsequently, the processing of FIG. 7 will be described relative to FIGS. 9A-9C, which mimic FIGS. 2A-2B, respectively, and represent more likely VLSI design possibilities. In this latter description, use of the $L_\infty$ metric will be explained.

In either case, partitioning and assignment of dimensions to a boundary of a shape can be based on a definition set 130 (FIG. 6). A definition set for dimensions (width and spacing) may vary depending on application. In addition, the definition set may require assignment of an actual figure or be a function dependent on some other dimension or characteristic. In view of the foregoing, the definition sets discussed below are meant to be illustrative only.

As an overview, the methodology includes: step S1, generate a core Voronoi diagram; step S2, partition edges into intervals (width and/or spacing); step S3, assign dimensions; and step S4, conduct design rule checking. For purposes of clarity, partitioning and assigning dimensions will be described together in a single section. That section includes sub-sections relating to the different metrics, shape configuration and special situations.

1. Generate Core Voronoi Diagram

Figure 8A:
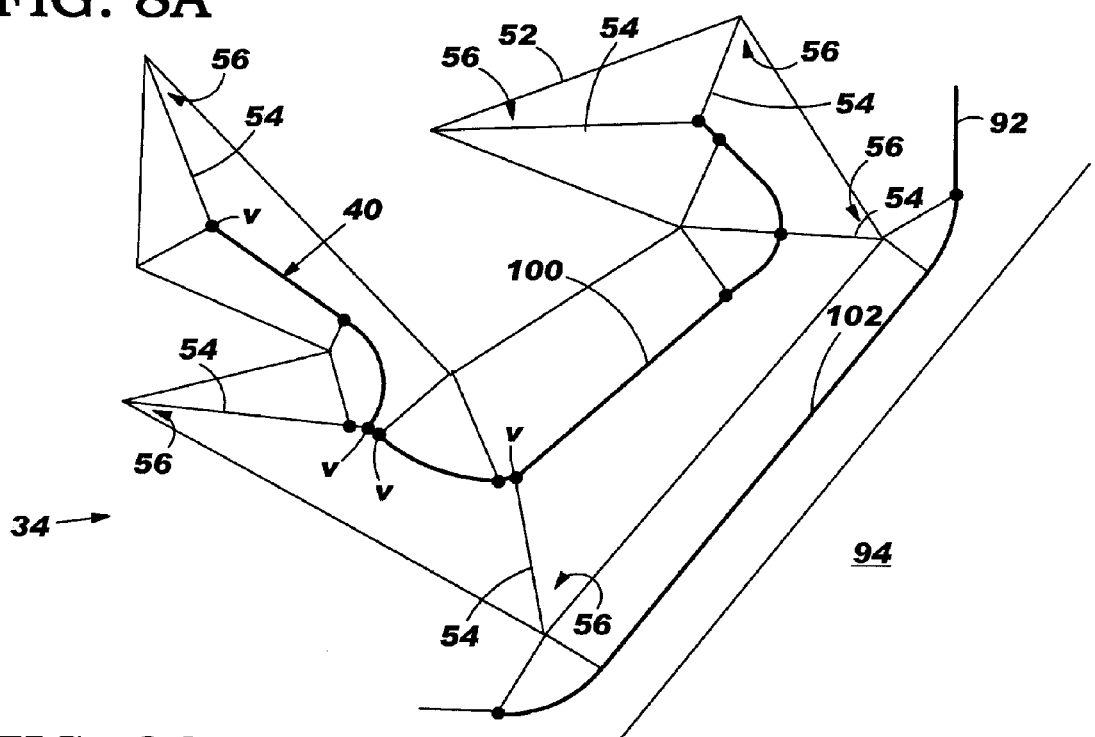
FIGS. 8A-8E show illustrative implementations of the method of FIG. 7 relative to the acute polygon of FIG. 3.

Referring to FIG. 8A, in a first step S1 (FIG. 7), a core 100, 102 for an interior and/or exterior Voronoi diagram 40 (i.e., medial axis) and 92, respectively, are generated for shapes of a given layer A of an IC by core Voronoi diagram generator 124 (FIG. 6). Step S1 may be segmented into step S1A for generating a Voronoi diagram, and step S1B for determining a core of the Voronoi diagram. Core Voronoi diagrams 100, 102 are generated as based on the Euclidean metric. Generation of Voronoi diagrams 40, 92 can be completed, for example, according to the algorithm described in U.S. Pat. No. 6,317,859, previously incorporated by reference. Generation of a core 100, 102 can be accomplished according to a set of user-defined rules to select only interesting portions of the respective Voronoi diagram. For example, as noted above, "uninteresting portions" (lighter lines) may be portions of Voronoi edges coupled to a boundary 52 of the shape, e.g., bisectors 54 between adjacent edges. In the case of IC shapes with acute angles, "uninteresting" can be a portion of a bisector 54 coupled to an acute angle 56 at a certain distance from acute angle 56. Once again, what is excluded from core 100, 102 can be flexible and application dependent.

FIGS. 2A and 2B also show a core 50 for an exterior and interior Voronoi diagram, respectively. However, these Voronoi diagrams are generated based on the $L_\infty$ metric. In terms of FIG. 2B, "uninteresting portions" (lighter lines) may be portions of Voronoi edges coupled to a boundary 52 of the shape, e.g., bisectors 54 between adjacent edges.

2. Partitioning into Intervals and Assigning Dimensions

A. Arbitrarily (Acute) Shaped Polygon with Euclidean Metric

Turning to FIGS. 8A-8D, in conjunction with FIG. 7, shape 34 of FIG. 3 is shown for description of the process. In addition, another shape 94 is provided for discussion of an exterior Voronoi diagram 92.

For arbitrarily shaped polygons, an illustrative definition set may be:

Definition 1 (Arbitrary case): The width of a point p on the boundary of shape P is the size of the smallest core-disk touching p in the interior of shape P. If there is no core-disk touching p, then p gets assigned the width of the nearest boundary point touched by a core-disk as the boundary of shape P is followed in a particular direction (clockwise or counterclockwise).

Definition 2 (Arbitrary case): The spacing of a point p on the boundary of shape P is the size of the smallest core-disk touching p in the exterior of shape P. If there is no core-disk touching p then p gets assigned the spacing of the nearest boundary point touched by a core disk as the boundary of shape P is followed in a particular direction (clockwise or counterclockwise).

In a second step S2 (FIG. 7), each edge of each shape is partitioned into at least one interval by partition generator 126 (FIG. 6). In one embodiment, this step includes partitioning each edge into width intervals using an interior core Voronoi diagram 100 and spacing intervals using an exterior core Voronoi diagram 102. Referring to FIG. 8B, partitioning into dimension intervals, in this case in the form of width intervals, w1-w26, is shown.

In one embodiment, partitioning is conducted by projecting (dashed projections 104) (only some shown) for a vertex v of core 100 (hereinafter "core vertex") to a corresponding boundary projection point 106 (only some shown) of shape 34. In this case, partitioning rules can be applied to address specific situations. One example set of partitioning rules are as follows:

a) For each core vertex v of a core bisector bisecting edges e1 and e2, project core vertex v to both edges e1 and e2 such that each projection is perpendicular to the respective edge. Referring to FIG. 8B, an example core vertex of a core bisector 100A bisecting edges 52A, 52B is core vertex v1. Projections 104A, 104B for core vertex v1 to both edges 52A, 52B are shown such that each projection 104A, 104B is perpendicular to the respective edge 52A, 52B. The result is width intervals w15 and w16 result on edge 52A and intervals w4 and w6 result on edge 52B.

b) For each core vertex v of a core bisector bisecting an edge e1 (or edges) and a concave vertex of a shape, project the core vertex perpendicular to edge e1 (or edges). A "concave vertex" is a vertex for which a line segment that connects points of edges forming the vertex is entirely outside of the shape, i.e., a vertex forming an angle greater than 180°.

Referring to FIG. 8B, an example core vertex v2 of a core bisector 100B that bisects an edge 52C and a concave vertex w7 of shape 34 is shown. (Note, concave vertices are labeled as intervals because each concave vertex represents an interval, as will be described in greater detail below.) In this case, a projection 104C is made from core vertex v2 perpendicular to edge 52C and edge 52C is partitioned accordingly, i.e., into width intervals w12, w13 based on projection 104C. Similarly, a core vertex v3 of a core bisector 100C that bisects an edge 52A and concave vertex w7 is shown. Projection 104D is made from core vertex v3 perpendicular to edge 52A to form intervals w14 and w15. Assignment of a dimension, as will be described below, for width intervals w12 and w13 are based on core vertex v2, and for width intervals w14 and w15 is based on the weighting of core vertex v3.

c) Each concave vertex is its own interval. In FIG. 8B, concave vertices are labeled with intervals w5, w7 and w23.

Returning to FIG. 8B, projections 104 define a list of intervals on boundary 52 of the shape. Based on the above projections, intervals w1-w26 result. It should be recognized that the projection rules can be modified to suit an application, and the above rules are only illustrative.

Figure 8C:
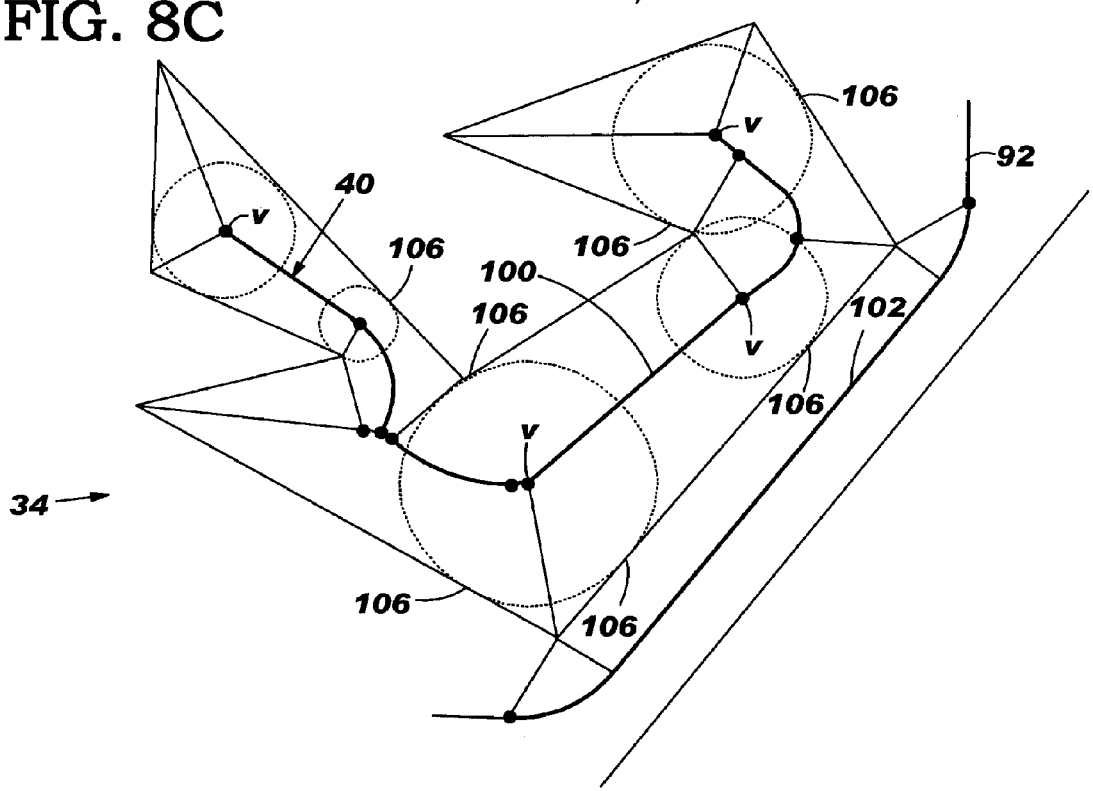
Figure 8B:
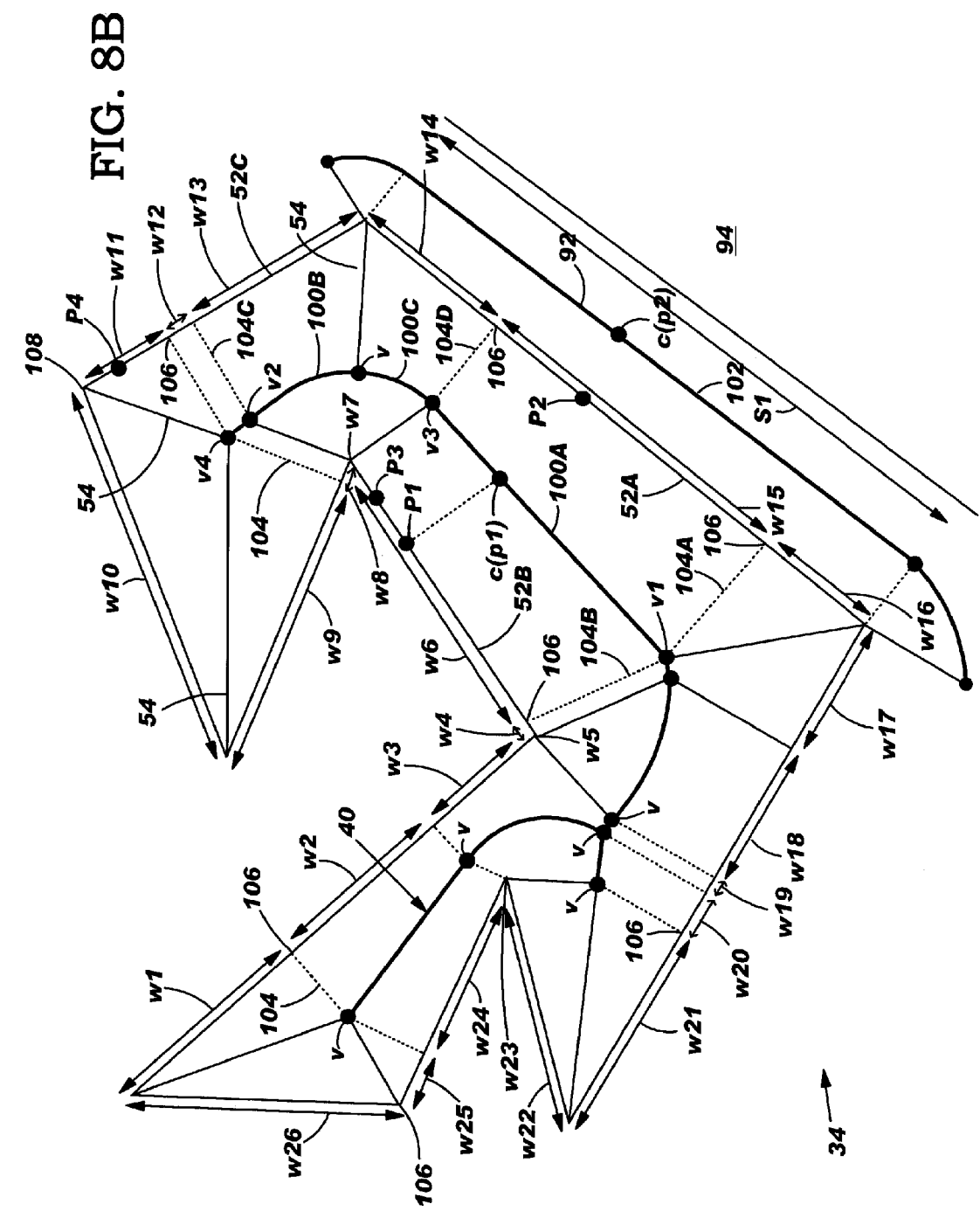
Figure 8D:
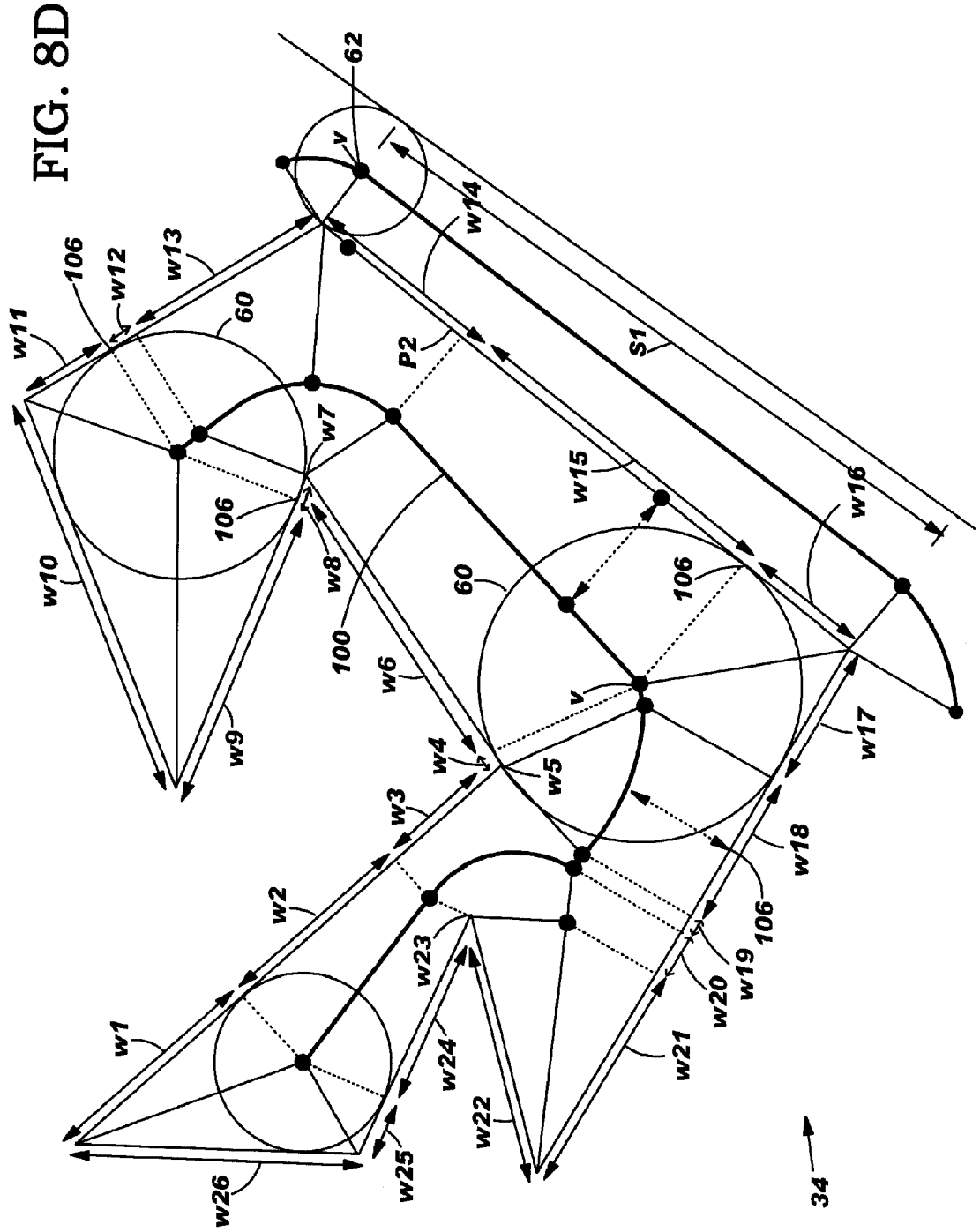

In an alternative embodiment shown in FIGS. 8C-8D, the partitioning may be made by generating the core-disk 60 centered at each core vertex v, and determining point(s) where the core disk 60 touches boundary 52 to form points 106. FIG. 8C shows smallest core disks 60 (Euclidean circles) for a variety of core points (not necessarily core vertices) of shape 34. In the Euclidean metric, there is at most one core-disk 60 touching a boundary point 106 except from concave vertices. (In the $L_\infty$ metric, there is more than one core-disk 60 touching a boundary point. Here, the invention may use the smallest core-disk 60 such that the smallest possible (narrowest) width/spacing values are assigned. However, a user may choose to use the size of the largest core-disk instead if the local width of concave vertices is to be ignored.) Referring to FIG. 8D, this embodiment provides the equivalent partitioning as projecting core vertices to boundary 52, as described above.

While the above description has been made relative to width intervals, it should be recognized that this process can be repeated for exterior core Voronoi 92 such that spacing intervals are derived. That is, as shown in FIG. 8B, projections from core vertices of core Voronoi 92 are made to boundary 52 to derive spacing intervals, e.g., s1. Alternatively, as shown in FIG. 8D, core disks 60 can be drawn at each core vertex, and the points at which the core disk touch boundary 52 can be used to derive spacing intervals, e.g., s1. Next, in step S3, assigning dimensions to each interval is conducted by dimension assigner 128 (FIG. 6) according to a selected definition set 130 (FIG. 6). It should be recognized that while the particular definition set provided above assigns actual dimensions, a definition set may assign dimensions as a function, e.g., width is twice the width of dimension X minus 10 nm. That is, a definition set may include a set of rules for partitioning and then assign a function. For each point p along an interval, a core point that projects to p, referred to as c(p), defines a dimension. For example, returning to FIG. 8B, a width for any point in, for example, intervals w9, w10, w11 is assigned a dimension equivalent to the weighting of a respective core point, i.e., vertex v4, where the weighting equals the diameter of a core disk centered at v4. This is consistent with Definition 1 above. Turning to interval w6, a width assigned to a point p1 along that interval has a variable width given by the diameter of a core disk centered at core point c(p1). This is also consistent with Definition 1 above. Also according to Definition 1, for a point P4 not touched by a core disk, the dimension assigned is the width of the nearest boundary point touched by a core-disk as the boundary of shape 34 is followed in a particular direction (clockwise or counterclockwise). Note that any point along intervals w9, w10, w11, the core point is core vertex v4.

Figure 8E:
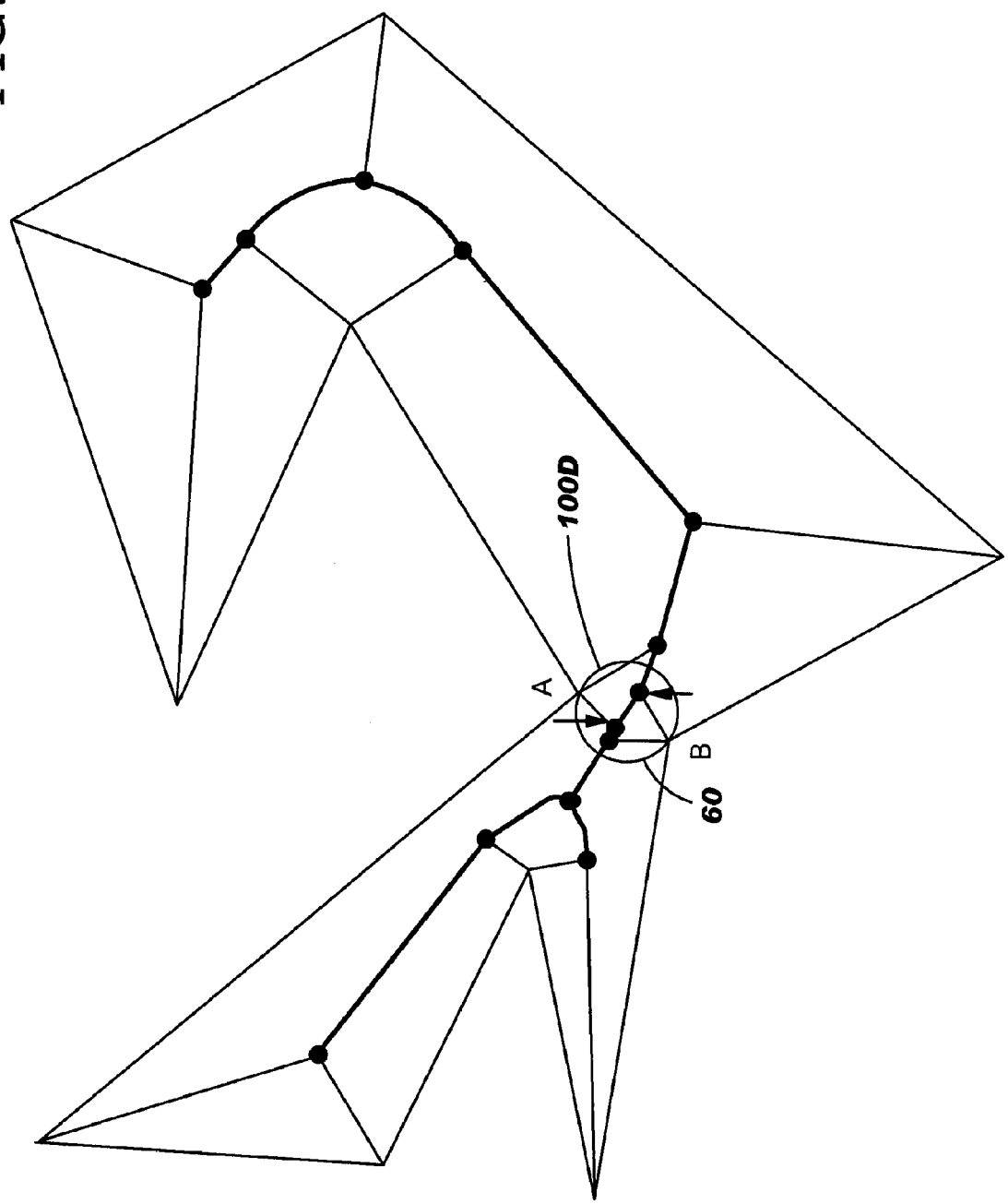

With regard to concave vertices w5, w7 and w23, as noted above, each concave vertex is an interval itself. In this case, assignment of a dimension is based on a number of core points (or weights of core points), i.e., exactly two core points for each of the two adjacent edges, and potentially a number of core points induced by Voronoi edges bisecting the concave vertex and other concave vertices (if any). In one embodiment, the dimension assigned is based on the minimum among the weights of these core points. For example, as shown in FIG. 8E, two concave vertices A, B can create a very thin neck in a shape. For a concave vertex A, determine the core point of minimum weight along the core bisectors induced by core vertex A. For example, in FIG. 8E, a core bisector 100D (between arrows) is induced by core vertices A and B, and vertices A, B are assigned the weight of the depicted core disk 60.

Assignment of spacing dimensions occurs in a similar fashion. For example, as shown in FIG. 8B, for a point P2 on edge 52A, the spacing of the point would be the weight of a projected core point c(p2), i.e., the largest core-disk touching point P2, i.e., twice the distance from core point c(p2) to point P2. If no core-disk touched a point, e.g. point P3, then the spacing is assigned the spacing of the nearest boundary point touched by a core disk.

B. Orthogonally (VLSI) Shaped Polygon with $L_\infty$ Metric

Figure 9A:
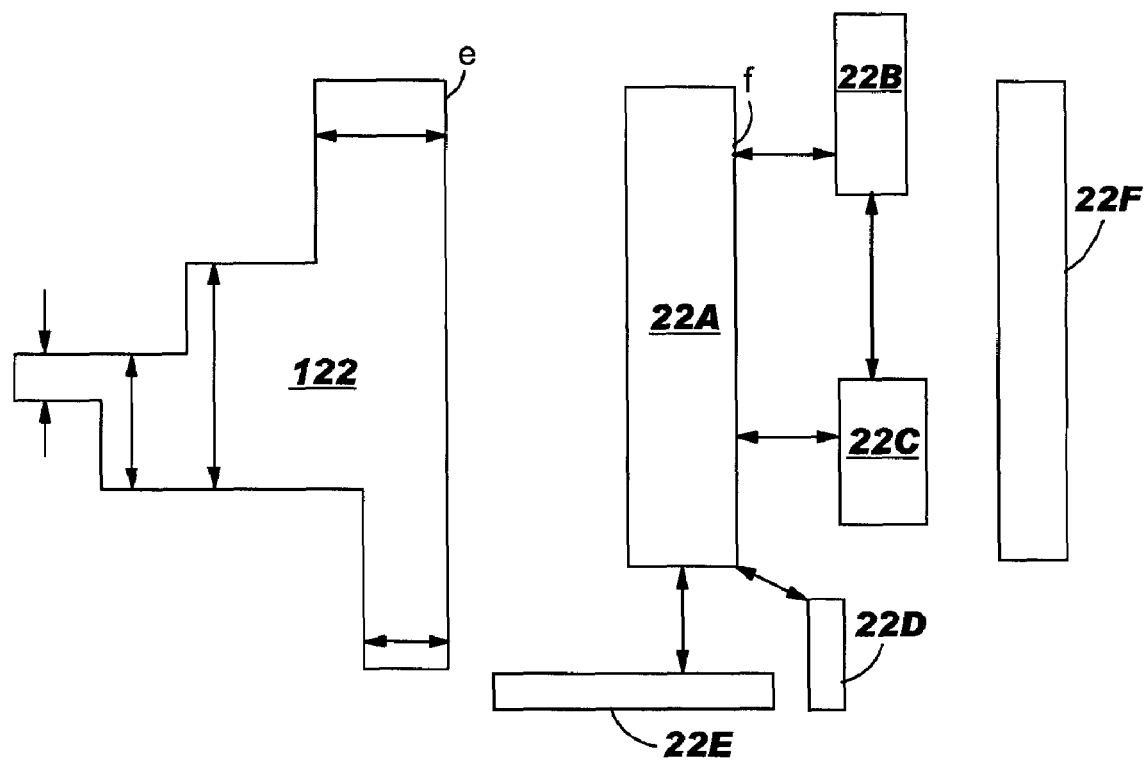
FIG. 9A shows illustrative local widths and spacings for the shapes of FIGS. 2A and 2B.

A description of the methodology applied to an orthogonal shape using the $L_\infty$ metric will now be made with reference to FIGS. 2A, 2B, 9B, 9C and 9D. The methodology for an orthogonally shaped polygon such as that shown originally in FIGS. 2A-2B is identical to that for an arbitrary polygon. However, the definition set may be altered to accommodate the different shapes, as will be described below. FIG. 9A shows with double-ended arrows illustrative important local widths and spacings for the group of shapes 22A-22F and 122 shown in FIGS. 2A and 2B, respectively. FIGS. 2A and 2B illustrate core Voronoi diagrams 50, and FIGS. 9B and 9C illustrate use of core Voronoi diagrams 50 to partition and assign dimensions, as will be described below.

As noted above, the following description will use the $L_\infty$ metric rather than the Euclidean metric. The Voronoi diagram for the $L_\infty$ metric is much easier to compute in practice than a Euclidean one. Moreover, a vast majority of VLSI shapes include an axis parallel edge or edges of slope +/−1 (ortho-45 shapes). In this case, the $L_\infty$ metric is very appropriate and simple to use. Where a general IC design contains an edge in more orientations than ortho-45 shapes, an approximation to an ortho-45 shape can be easily made to compute the $L_\infty$ metric Voronoi diagram.

Interval size can be determined based on the definition set that provides a "partitioning profile." For a larger partitioning, in the case of an orthogonal polygon(s), as shown in FIGS. 9B-9C, a definition set may be based on a "largest empty disk (square)" partitioning profile. Note that the following definitions are derived from Definition 1 and 2 by taking into account that a core square touching an orthogonal edge in the $L_\infty$ metric need not be unique as in the Euclidean case. A definition set is as follows:

Definition 3 (Orthogonal case): The width of any boundary point p along an edge e of a shape P is the size of the largest square touching p (along e) that is entirely contained in the interior of P.

Definition 4 (Orthogonal case): The spacing of any boundary point p along an edge e of a shape P is the size of the largest square touching p (along e) that lies entirely in the free space, i.e., it does not intersect P or any other shape.

Concave corners present a special case similar to the Euclidean case of concave vertices. In particular, concave corners have a width/spacing just as any other point p on the incident edges, and also have a corner width/spacing. Accordingly, the following definitions are presented to address concave corners:

Definition 5 (Orthogonal case): The corner width of a concave corner point p of a shape P is the size of the largest square cornered at p entirely contained in the interior of P. The width of concave corner p is the smallest among the widths of the two edges incident to p and the corner width of p.

Definition 6 (Orthogonal case): The corner spacing of a concave corner point p of a shape P is the size of the largest square cornered at p entirely contained in the free space. The spacing of concave corner p is the smallest among the spacings of the two edges incident to p and the corner spacing of p.

(It should be recognized that the definition set may be altered to form smaller intervals and smaller dimensions by using a smallest possible core square partitioning profile for each vertex to determine interval partitioning and dimension assignment. This results in more intervals for each edge.) Returning to the methodology, in second step S2 (FIG. 7), partitioning of each edge of each shape into dimension intervals is conducted by partition generator 126 (FIG. 6). In one embodiment, this step includes partitioning into width intervals using an interior core Voronoi diagram 50 (FIG. 2B) and partitioning into spacing intervals using an exterior core Voronoi diagram 50 (FIG. 2A).

Returning to FIG. 2A-2B, partitioning into dimension intervals for orthogonally shaped polygons includes evaluating or scanning a Voronoi cell of an edge, e.g., edge e, to identify Voronoi core vertices v induced by that edge e. For example, referring to FIG. 2B, edge e of polygon 70 has five Voronoi vertices v1, v2, v3, v4, v5 adjacent thereto, and, as shown in FIG. 2A, edge f of polygon 22A has three Voronoi vertices v4, v5, v6 adjacent thereto. For each Voronoi vertex v encountered, as shown in FIGS. 2A, 2B, a core square 60 centered at the Voronoi vertex v is generated. Since the Voronoi diagrams are generated using the $L_\infty$ metric, core elements are square. The core square has a side length twice the weight of the Voronoi vertex, i.e., twice the weight of the core point identical to the Voronoi vertex. Note that this step is equivalent to projecting core vertex v on the boundary of a shape along directions +1 and/or −1. Whether the direction +1 or −1 is used depends on the slope of the boundary edge.

In one embodiment, derivation of intervals can proceed based on a desired partitioning profile. This is similar to the simplified process presented relative to arbitrary shapes. In this embodiment, for example, partitioning can be conducted such that the intervals are as large as possible (coarser partitioning profile) or as small as possible (narrow/fine partitioning profile). In the former case, a largest empty core square possible at each vertex is evaluated to determine interval partitioning. For example, referring to FIG. 9B, for edge f, three spacing intervals s1, s2, s3 are generated because three largest squares 168, 170, 172 along edge f are possible (for core vertices v4, v5, v6 in FIG. 2A). Similarly, referring to FIG. 9C, for edge e, three width intervals w1, w2, w3 are generated because three largest core squares 162,164,166 (for core vertices v1, v3 and v5 in FIG. 2B) along edge e of the shape are possible. In some cases, some core squares may overlap with each other because a core square touches an axis parallel boundary edge with its whole side and not only with its corner. See, for example, core square 177 and core square 164 in FIG. 9C. In one embodiment, for any overlapping portions of a core square, only the portion of largest weighting is maintained, and portions of a smaller weighting are eliminated. Alternatively, other user-defined rules may be implemented to address overlapping core squares. In FIG. 9C, core squares 177, 178 for vertices v2 and v4 do not provide the largest core squares at the vertices and, hence, they are eliminated. The above-described process is repeated for both the interior (for width) face and exterior (for spacing) face of each edge.

Next, in step S3, assigning actual or function dimensions to each interval is conducted by dimension assigner 128 (FIG. 6). In one embodiment, step S3 includes implementation of a definition set 130 (FIG. 6) to assign dimensions to each interval. As noted above, according to the invention, a definition set for dimensions (width and spacing) may vary depending on application. In addition, the definition set may require assignment of an actual figure or be a function dependent on some other dimension or characteristic. It should be recognized that the particular partitioning profile used to partition each edge into intervals does not require implementation of a corresponding dimension assignment profile. For example, a user may partition an edge based on a largest empty core square partitioning profile to attain larger intervals, and then assign dimensions based on a definition set that assigns the smallest possible dimension.

Referring to FIG. 9B, for edge f of polygon 22A, any point within the three spacing intervals s1, s2, s3 is each assigned the dimension of their respective three largest squares 168, 170, 172 according to Definition 4. That is, any point p within an interval is assigned the weight of its unique core point c(p), referred to as the core point that projects to p. For any p that is part of an axis parallel edge, c(p) is the center of the largest core square touching p. Note that the dimensions of squares 168 and 172 are limited by the horizontal dimension, while square 170 is limited by the vertical dimension. Referring to FIG. 9C, for edge e, any point p within the three width intervals w1, w2, w3 are each assigned the width of the respective largest core square, i.e., core point that projects to p, according to Definition 3. Note that the dimensions of squares 162 and 166 are limited by the horizontal dimension, while square 164 is limited by the vertical dimension.

Figure 9D:
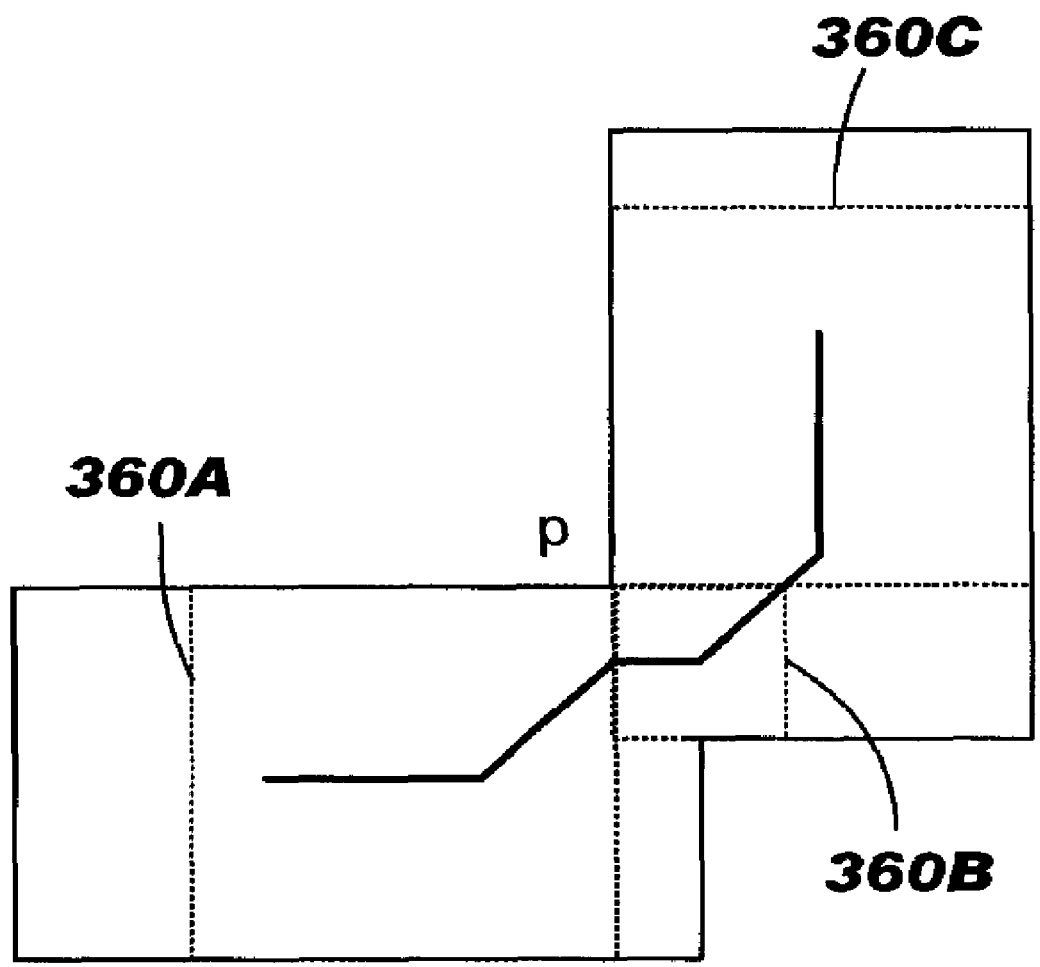
FIG. 9D shows a detail of a polygon with a thin neck caused by concave vertices.

With regard to a corner width, as shown in FIG. 9C, the corner width of a point p is the size of largest square that is cornered at p and entirely contained in the interior of polygon according to Definition 5. In addition, the width of corner p is the smallest among the widths of the two edges g, h incident to p and the corner width of p. With regard to corner spacing, as shown in FIG. 9B, the corner spacing of a corner point p of polygon 22A is the size of the largest square 178 cornered at p entirely contained in the free space according to Definition 6. In addition, the spacing of corner p is the smallest among the spacings of the two edges f, i incident to p, i.e., square 172 or 176, and the corner spacing of p, i.e., the size of square 178 at the corner of p. Note that the largest empty square 178 cornered at a corner p gives the $L_\infty$ nearest neighbor to corner p that may not be the same as the Euclidean nearest neighbor. The difference, however, between the two is small and negligible in practice. Once the $L_\infty$ nearest neighbor to p is identified, the numeric distance can be reported in the ordinary (Euclidean) manner, e.g., 160A instead of 160B. Another example of corner width determination is shown in FIG. 9D. In this case, an orthogonal shape includes three core squares 360A-C (dashed boxes) at a concave corner p. In this case, the core square 360B would be used to define the width of corner p.

It should also be recognized that each interval may be assigned a function that determines its dimension(s) rather than a numerical value based on its associated core square. For example, an interval s1 in FIG. 9B may be given a function that assigns its width as 2 times the size of the width of polygon 22B minus 10 nm.

1) Handling of Ortho-45° Edges

Referring to FIGS. 1A-10D, various arrangements of widths for shapes containing 45° edges are illustrated. The methodology is the same as described above. Portions of a medial axis 250, 252 not included in the core are shown with dashed lines 202.

Figure 10A:
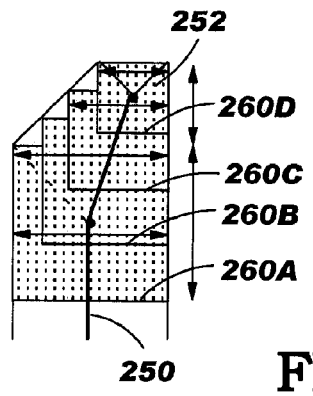
FIGS. 10A-10D show illustrative edge arrangements including non-orthogonal angles.

FIG. 10A illustrates core squares 260A-D for core 250 corresponding to a 45° line. In this case, partitioning is based on the largest core squares 260A and 260D along a boundary edge, which results in two intervals.

Figure 10B:
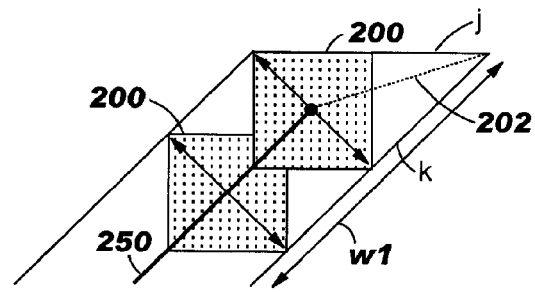
Figure 10C:
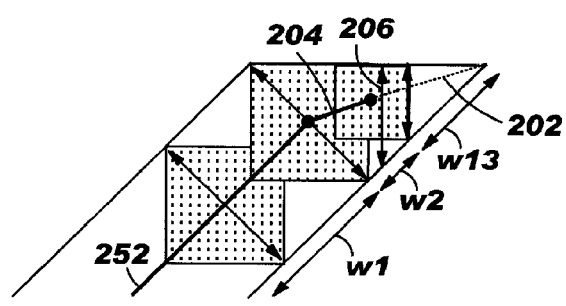

As shown in FIG. 10B, for intervals corresponding to two parallel 45° lines, the invention may use the diameter of a core square 200. In the case of two parallel 45° lines, the Euclidean and $L_\infty$ metric reach their greatest difference in values. To simulate Euclidean distance, the size of a core square, in this case, can be defined to be the length of the diagonal of the core-square. Note that the length of the diagonal equals the Euclidean distance between the two parallel 45° lines. In all remaining cases, size is determined by the length of the side of the corresponding core square. FIGS. 10B and 10C also illustrate the advantages of being able to select a core, i.e., based on what is interesting and uninteresting. In FIG. 10B, a bisector 202 of adjacent edges j, k is excluded from core 250. Thus, the same width w1 may be assigned to the whole 45° edge k, even in the portion close to the acute angle. In FIG. 10C, a portion 204 of bisector 202 incident to the acute angle is included in core 252, and thus three intervals w1, w2 and w3 are generated, where w3 is assigned the constant value of the small vertical arrow 206. Note also that once intervals w2 and w3 are obtained, any reasonable numeric value approximating the Euclidean metric may be assigned, if desirable.

Figure 10D:
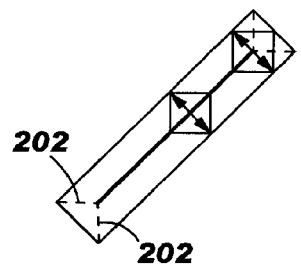

FIG. 10D illustrates the case of two perpendicular 45° edges forming a 90° angle, which correspond to a rotated rectangle. This case is handled similarly to that of FIG. 10A.

2) Arbitrarily (Acute) Shaped Polygon with $L_\infty$ metric

Figure 11:
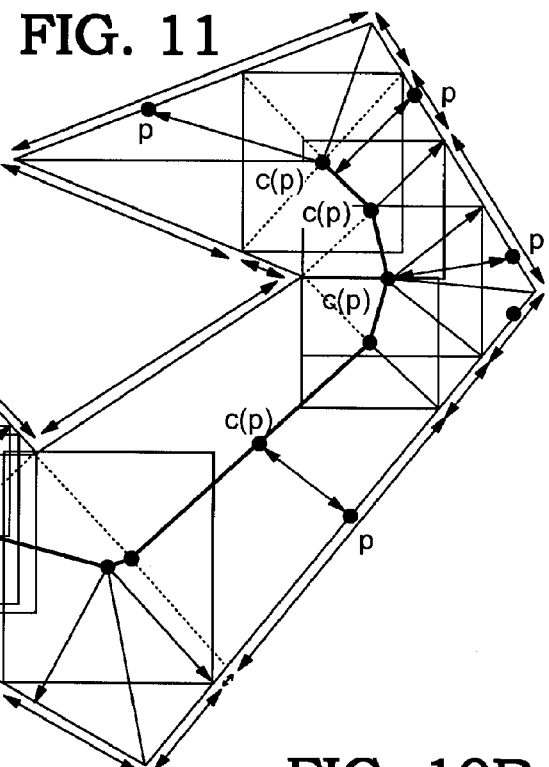
FIG. 11 shows the shape of FIG. 4 including partitioning according to the $L_\infty$ metric.

Referring to FIG. 11, the arbitrary shape 34 of FIG. 4 is shown including partitioning according to the $L_\infty$ metric. Where the $L_\infty$ metric is applied to non-orthogonal shapes, a definition set may be as follows:

Definition 7 (Arbitrary case): The width of any boundary point p along a boundary of shape P is the size of the largest core square touching p in the interior of shape P. If there is no core-square touching p, then p gets assigned the width of the nearest boundary point touched by a core square.

Definition 8 (Arbitrary case): The spacing of any boundary point p along a boundary of shape P is the size of the largest core square touching p in the exterior of shape P. If there is no core-square touching p, then p gets assigned the spacing of the nearest boundary point touched by a core square.

As noted above, special care must be taken for concave corners. In particular, concave corners represent an interval by themselves. That is, they have a width/spacing just as any other point p in an edge, and also have a corner width/spacing. Accordingly, the following definitions are presented to address corners:

Definition 9 (Arbitrary case): The corner width of a concave corner point p of a shape P is the size of the smallest among all core square cornered at p.

Figure 12:
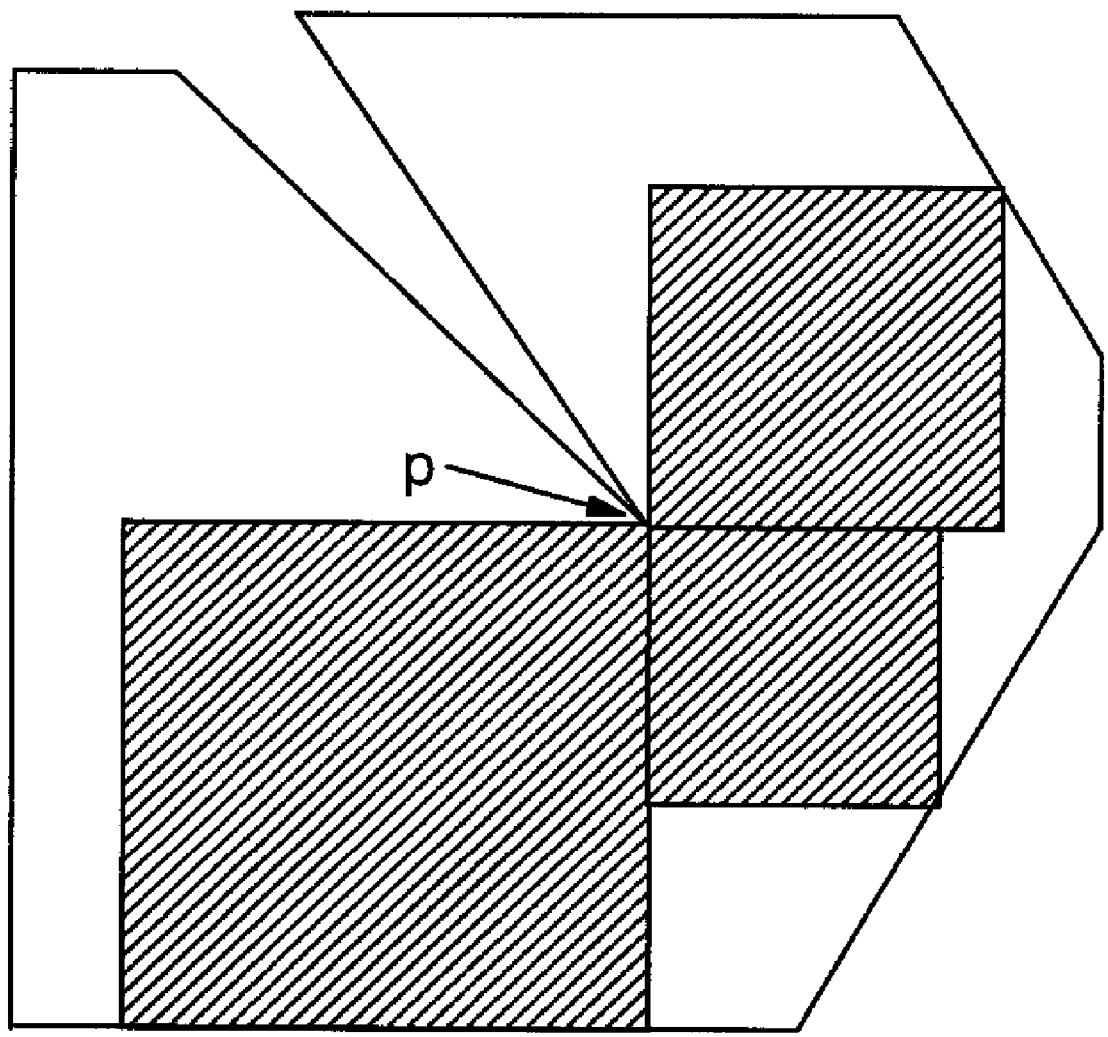
FIG. 12 shows a detail of polygon having a concave vertex.

Referring to FIG. 12, there may be at most 3 core squares cornered at a concave corner p depending on the slopes of the incident edges. In the orthogonal case, there are exactly 3 core squares cornered at p.

Definition 10 (Arbitrary case): The corner spacing of a concave corner point p of a shape P is the size of the smallest core square cornered at p entirely contained in the free space.

3) Improved Accuracy: Combination $L_\infty$ metric and Euclidean Metric:

Because shapes are in their majority axis parallel and because the $L_\infty$ Voronoi diagram is easier to compute, the invention preferably uses the $L_\infty$ metric. In an alternative embodiment, if more accuracy is desired, an approximation to the Euclidean metric can be implemented by, as shown in FIG. 13:

First, partitioning the boundary of a shape into intervals according to the $L_\infty$ metric, i.e., the definition based on the largest square centered along the $L_\infty$ core as given in Definitions 5-6. Second, the Euclidean metric can be used to assign dimension. This procedure can be completed as follows: Consider a core square D centered at core point c(p). Points p1 and p2 are neighbors of point p, and vice versa. Similarly edges e1 and e2 are neighbors of point p. Instead of assigning the side of core square D as the width of p, Euclidean based metrics may be used. For example, the size of a circle defined by point p, edge e1 and edge e2 may be used. Alternatively, the size of a circle centered at core point c(p), or the distance between point p and edge e2 (shown by double ended arrow), or the distance between point p and edge e1 (shown by double ended arrow) may be used.

Figure 13:
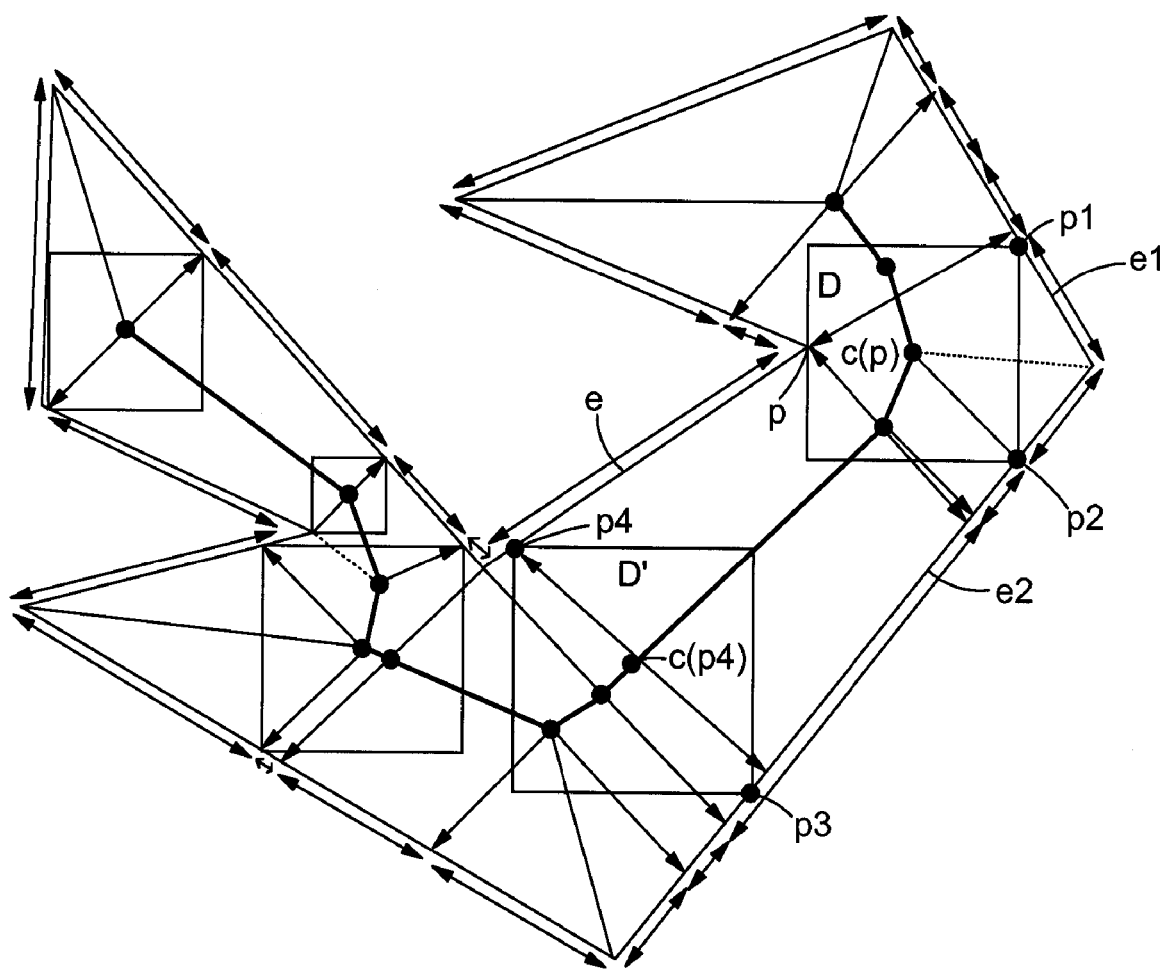
FIG. 13 shows the shape of FIG. 4 partitioned using $L_\infty$ metric and assigned dimensions using the Euclidean metric.

As another example, as shown in FIG. 13, points p3 and p4 are neighbors. Instead of assigning the side of core square D' as the width of p3 and p4, the Euclidean based distance between point p4 and edge e1, or the size of a circle centered at core point c(p4), or the diagonal of core square D', etc., may be used.

4) Fine and Narrow Partitioning

In certain applications the focus of width and spacing is to evaluate a shape and the spacing around a shape as "narrow" and as "thin" as possible. In particular, in the area of VLSI yield and critical area calculations, the notion of shorts and opens is widely used. As noted above in the definition section, a "spot defect" causes a short or an open where a "short" is a defect creating a bridge with some other edge in the exterior of a shape and an "open" is a defect creating a bridge in the interior of a shape. In addition, a defect may be modeled as a core element in the form of a circle or a square.

In order to implement the invention to partition and assign dimensions in terms of a "narrow" or "thin" evaluation, the following definition set (for $L_\infty$ and Euclidean metric) may be used:

Definition 11: The width of any boundary point p of shape P is the radius of the smallest core element (defect) centered at p causing an open for shape P. The spacing of the boundary point p is the radius of the smallest core element (defect) centered at p that causes a short.

Definition 12: An open is an element totally covering a core element that is centered on a core point in the interior of a shape P. A short is an element totally covering a core element that is centered on a core point in the exterior of a shape P.

Figure 14A:
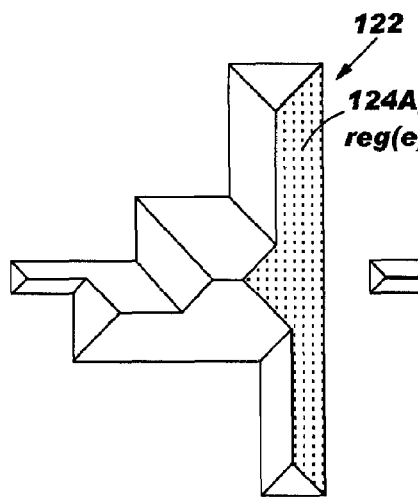
FIGS. 14A-14F show the shape of FIGS. 2B and 9C for narrower partitioning.
Figure 14B:
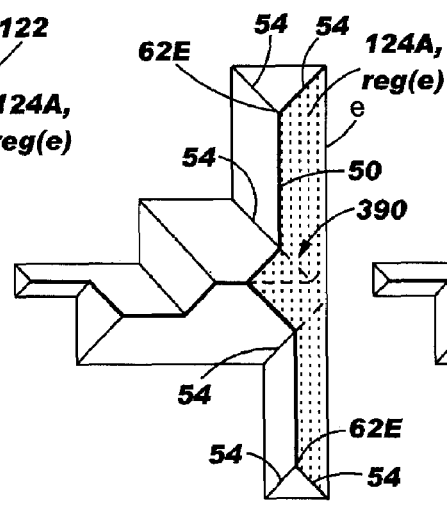

Returning to the methodology and referring to FIGS. 14A-14E, partitioning of an edge e into width/spacing intervals based on Definition 11 will now be described. FIG. 14A shows an interior Voronoi cell 124A (also denoted reg(e) and shaded) of shape 122 (from FIGS. 2B and 9C). FIG. 14B shows a second ($2^{nd}$) order Voronoi diagram 390 (dashed lines) of shape 122 within Voronoi cell 124A (also denoted reg(e)) that is the Voronoi diagram of shape 122 truncated within reg(e). The 2nd order Voronoi diagram within Voronoi cell 124A is generated by extending in Voronoi cell 124A all bisectors 54 incident to Voronoi cell 124A except those incident to endpoints 62E of a core 50, i.e., except those induced by an edge adjacent to e. The 2nd order Voronoi diagram for opens within cell 124A is the 2nd order Voronoi diagram of shape 122 within the cell excluding in addition to edge e the two edges of shape 122 neighboring edge e. For simplicity, the 2nd order Voronoi diagram 390 for opens may be referred to as the "2nd order Voronoi diagram" or the "2nd order Voronoi partitioning within reg(e)."

Figure 14C:
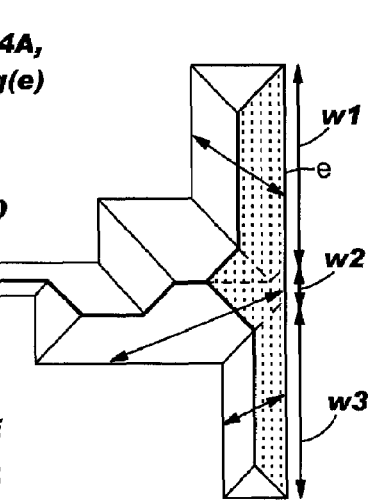

The 2nd order Voronoi partitioning within reg(e) partitions edge e into intervals w1, w2, w3. Each interval has an "owner," i.e., an edge or concave corner or a core Voronoi vertex that induces that interval. In FIG. 14C, intervals and their owners are indicated by double arrows. The width of any point p along an interval w is simply the distance of p from the owner of the interval. In case the owner of an interval is a core point as shown in FIG. 14E, the weight of the core point is added to the derivation of the width, i.e., the width is the size of the core disk centered at that core point.

Figure 14D:
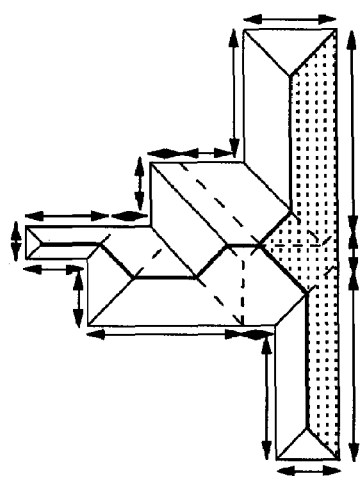
Figure 14E:
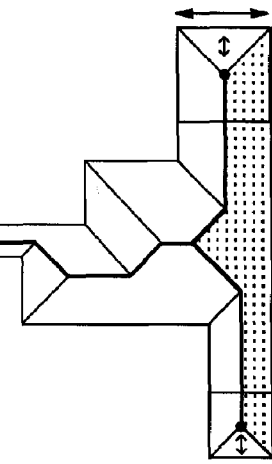
Figure 14F:
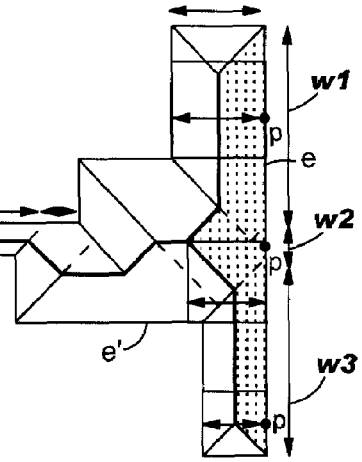

FIG. 14D shows the 2nd order Voronoi partitioning of each Voronoi cell of shape 122 as well as the width intervals. FIG. 14F shows the actual width values obtained for the 3 intervals of edge e. Note, the top and bottom interval w1, w3 have constant width while the middle interval w2 has a variable width equal to the distance of any point p along that interval from the horizontal edge e'.

It should be recognized that although the $L_\infty$ metric has been used in FIGS. 14A-14F, the Euclidean metric may be used when reporting distances between a point along an interval and its owner.

In the orthogonal case under the $L_\infty$ metric only the width/spacing definition of this section is equivalent to the one in the previous section Definition 9-10, if we always choose the smallest core-square touching a point p to derive its width.

3. Design Rule Checking

Returning to FIG. 7, once intervals and associated dimension(s), i.e., width/spacing, have been assigned, in step S4, data can be used to conduct any design rule checking involving width and spacing using conventional technology. For example, width and/or spacing dimensions for any single edge may be compared to check rules involving the width and/or spacing dimension of the single edge. Similarly, width and/or spacing dimensions for pairs of neighboring shapes and/or pairs of neighboring edges may be compared to check rules involving pairs of neighboring shapes and/or edges.

It should also be recognized that the above invention is not limited to application within a layer A of an IC. In an alternative embodiment, for check rules involving shapes in more than one layer of an IC, e.g., a layer A and a layer B, a Voronoi diagram for the combined layers can be used. For example, for each edge of layer A, spacing intervals can be derived with edges in layer B using the combined Voronoi diagram. The spacing intervals can then be used to compare to check rules involving layer A and layer B.

V. Conclusion

In the previous discussion, it will be understood that the method steps discussed are performed by a processor, such as PU 114 of system 100, executing instructions of program product 122 stored in memory. It is understood that the various devices, modules, mechanisms and systems described herein may be realized in hardware, software, or a combination of hardware and software, and may be compartmentalized other than as shown. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods and functions described herein, and which—when loaded in a computer system—is able to carry out these methods and functions. Computer program, software program, program, program product, or software, in the present context mean any expression, in any language, code or notation, of a set of instructions intended to cause a system having an information processing capability to perform a particular function either directly or after the following: (a) conversion to another language, code or notation; and/or (b) reproduction in a different material form.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of modeling for use with an integrated circuit (IC) design, the method comprising:
   partitioning an edge of a shape in the IC design into a plurality of intervals using an IC modeling system; and
   assigning at least one dimension to each interval
   wherein the partitioning includes:
      generating a core Voronoi diagram for the shape; and
      partitioning the edge based on a core element for each vertex of the core Voronoi diagram, the core element being one of a largest possible core element and a smallest possible core element; and
   wherein in the case that the core element is the largest possible core element, the intervals are as large as possible, and wherein in the case that the core element is the smallest possible core element, the intervals are as small as possible.

2. The method of claim 1, further comprising using the at least one dimension to evaluate a check rule.

3. The method of claim 2 wherein the check rule involves at least one of: a single edge, a pair of neighboring edges, and edges within more than one layer of the IC design.

4. The method of claim 1, wherein each concave vertex of the shape is an interval.

5. An integrated circuit (IC) modeling system comprising:
   means for partitioning an edge of a shape in the IC design into a plurality of intervals; and
   means for assigning at least one dimension to each interval
   wherein the partitioning means includes
      means for generating a core Voronoi diagram for the shape; and
      means for partitioning the edge based on a core element for each vertex on the core Voronoi diagram, the core element being one of a largest possible core element and a smallest possible core element; and
   wherein in the case that the core element is the largest possible core element, the intervals are as large as possible, and wherein in the case that the core element is the smallest possible core element, the intervals are as small as possible.

6. The system of claim 5, further comprising means for using the at least one dimension to evaluate a check rule.

7. The system of claim 6, wherein the check rule involves at least one of: a single edge, a pair of neighboring edges, and edges within more than one layer of the IC design.

8. A computer program product comprising a computer useable medium having computer readable program code embodied therein, which when executed by a computer system, enables the computer system to model an integrated circuit, the program product comprising:
   program code configured to partition an edge of a shape in the IC design into a plurality of intervals; and
   program code configured to assign at least one dimension to each interval
   wherein the partitioning program code includes;
      program code configured to generate a core Voronoi diagram for the shape; and
      program code configured to partition the edge based on a core element for each vertex on the core Voronoi diagram, the core element being one of a largest possible core element and a smallest possible core element; and
   wherein in the case that the core element is the largest possible core element, the intervals are as large as possible, and wherein in the case that the core element is the smallest possible core element, the intervals are as small as possible.

9. The program product of claim 8, wherein the at least one dimension includes a width for each interval and a spacing to a neighboring shape for each interval, and the at least one dimension is a function of another dimension.

10. The program product of claim 8, further comprising the program code configured to use the dimensions to evaluate a check rule.

11. The program product of claim 10, wherein the check rule involves at least one of: a single edge, a pair of neighboring edges, and edges within more than one layer of the IC design.

12. An integrated circuit (IC) check rule evaluation system comprising:
   means for partitioning an edge of a shape in the IC design into a plurality of intervals, the partitioning means including:
      means for generating a core Voronoi diagram for the shape using a first metric, and
      means for partitioning the edge based a core element for each vertex on the core Voronoi diagram;
   means for assigning at least one dimension to each interval using a second metric;
   means for using the at least one dimension to evaluate a check rule; and
   wherein in the case that the core element is the largest possible core element, the intervals are as large as possible, and wherein in the case that the core element is the smallest possible core element, the intervals are as small as possible.

13. The IC check rule evaluation system of claim 12, wherein the check rule is a width dependent spacing rule.

* * * * *